(12) United States Patent
Terao et al.

(10) Patent No.: US 11,270,926 B2
(45) Date of Patent: Mar. 8, 2022

(54) HEAT SINK AND METHOD FOR MANUFACTURING SAME

(71) Applicant: JFE PRECISION CORPORATION, Niigata (JP)

(72) Inventors: Hoshiaki Terao, Niigata (JP); Kouichi Hashimoto, Niigata (JP)

(73) Assignee: JFE PRECISION CORPORATION, Niigata (JP)

( * ) Notice: Subject to any disclaimer, the term of this patent is extended or adjusted under 35 U.S.C. 154(b) by 322 days.

(21) Appl. No.: 16/328,426

(22) PCT Filed: Aug. 21, 2017

(86) PCT No.: PCT/JP2017/029787
§ 371 (c)(1),
(2) Date: Feb. 26, 2019

(87) PCT Pub. No.: WO2018/043179
PCT Pub. Date: Mar. 8, 2018

(65) Prior Publication Data
US 2020/0051889 A1    Feb. 13, 2020

(30) Foreign Application Priority Data

Aug. 31, 2016 (JP) .............................. JP2016-170339
Aug. 15, 2017 (JP) .............................. JP2017-156796
Aug. 18, 2017 (JP) .............................. JP2017-158064

(51) Int. Cl.
*H01L 23/373* (2006.01)
*B32B 15/20* (2006.01)
(Continued)

(52) U.S. Cl.
CPC ........ *H01L 23/3735* (2013.01); *B22F 3/1007* (2013.01); *B22F 7/062* (2013.01);
(Continued)

(58) Field of Classification Search
None
See application file for complete search history.

(56) References Cited

U.S. PATENT DOCUMENTS

| 7,951,467 B2 | 5/2011 | Tsushima |
| 2002/0191377 A1 | 12/2002 | Osada et al. |

(Continued)

FOREIGN PATENT DOCUMENTS

| JP | H11307701 A | 11/1999 |
| JP | 2000323632 A | 11/2000 |

(Continued)

OTHER PUBLICATIONS

Sep. 19, 2017, International Search Report issued in the International Patent Application No. PCT/JP2017/029787.

(Continued)

*Primary Examiner* — Adam Krupicka
(74) *Attorney, Agent, or Firm* — Kenja IP Law PC

(57) ABSTRACT

Provided is a heat sink that has a clad structure of a Cu—Mo composite material and a Cu material and has a low coefficient of thermal expansion and high thermal conductivity. The heat sink comprises a pair of Cu—Mo composite layers and a Cu layer stacked in a thickness direction so that the Cu layer is interposed between the Cu—Mo composite layers or comprises three or more Cu—Mo composite layers and two or more Cu layers alternately stacked in the thickness direction so that two of the Cu—Mo composite layers are outermost layers on both sides, wherein each of the Cu—Mo composite layers has a thickness section microstructure in which flat Mo phase is dispersed in a Cu matrix. Such a clad structure achieves high thermal conductivity together with a low coefficient of thermal expansion.

24 Claims, 7 Drawing Sheets

(51) Int. Cl.
  *B22F 3/10* (2006.01)
  *B22F 7/06* (2006.01)
  *B22F 7/08* (2006.01)
  *B23P 15/26* (2006.01)
  *B32B 15/01* (2006.01)
  *C22C 1/04* (2006.01)
  *C22C 27/04* (2006.01)
  *F28F 21/08* (2006.01)

(52) U.S. Cl.
  CPC ............... *B22F 7/08* (2013.01); *B23P 15/26* (2013.01); *B32B 15/01* (2013.01); *B32B 15/20* (2013.01); *C22C 1/045* (2013.01); *C22C 27/04* (2013.01); *F28F 21/085* (2013.01); *B22F 2007/066* (2013.01); *B22F 2301/10* (2013.01); *B22F 2998/10* (2013.01); *B22F 2999/00* (2013.01); *B23P 2700/10* (2013.01)

(56) References Cited

U.S. PATENT DOCUMENTS

2017/0198991 A1* 7/2017 Oki .................. B32B 15/01
2017/0317009 A1   11/2017 Fukui
2018/0033716 A1*  2/2018 Viswanathan .......... H01L 24/83

FOREIGN PATENT DOCUMENTS

| | | |
|---|---|---|
| JP | 2001358266 A | 12/2001 |
| JP | 2003037230 A | 2/2003 |
| JP | 2003100930 A | 4/2003 |
| JP | 2007115731 A | 5/2007 |
| JP | 5818045 B1 | 11/2015 |
| WO | 2015182385 A1 | 12/2015 |
| WO | 2016088687 A1 | 6/2016 |

OTHER PUBLICATIONS

Jun. 20, 2020, Office Action issued by the Korean Intellectual Property Office in the corresponding Korean Patent Application No. 10-2019-7008727 with English language concise statement of relevance.

Jun. 3, 2019, the Extended European Search Report issued by the European Patent Office in the corresponding European Patent Application No. 17846187.7.

Feb. 13, 2021, Office Action issued by the Korean Intellectual Property Office in the corresponding Korean Patent Application No. 10-2019-7008727.

* cited by examiner

FIG. 3

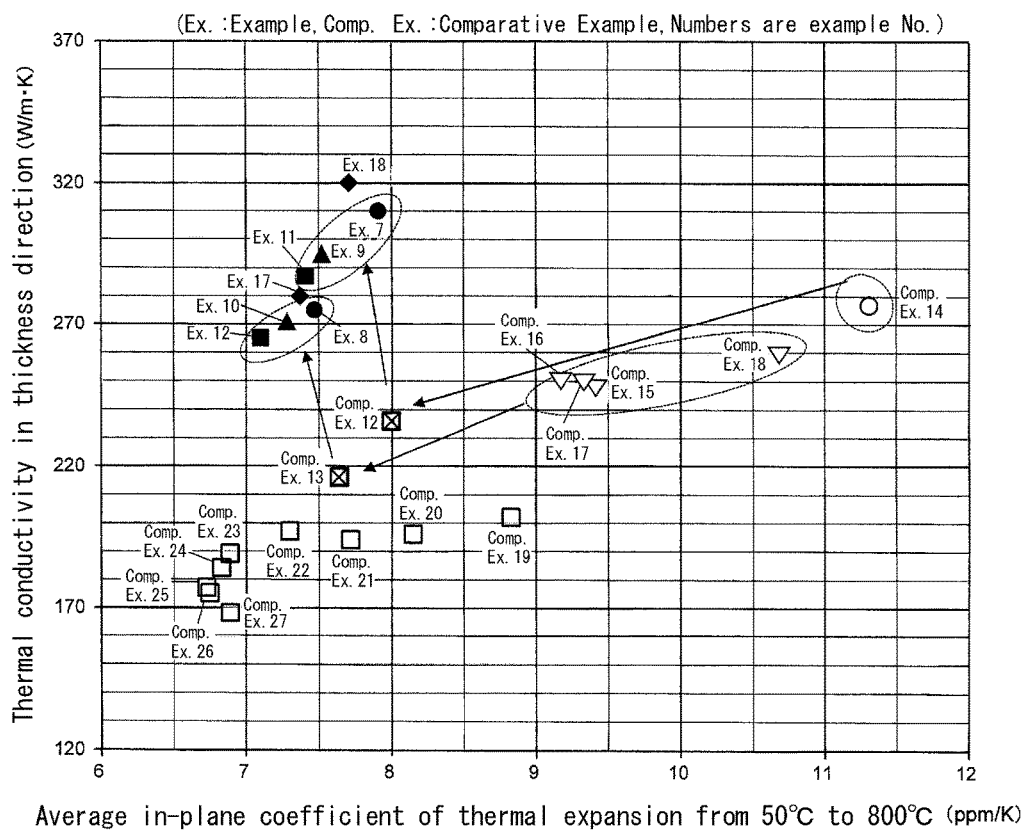

(Ex.: Example, Comp. Ex.: Comparative Example, Numbers are example No.)

- ● Three-layer clad material of Example 7, Cu-Mo composite layer: 25%Cu-Mo, density 9.33, total cold rolling reduction 95%
  Three-layer clad material of Example 8, Cu-Mo composite layer: 25%Cu-Mo, density 9.42, total cold rolling reduction 95%
- ▲ Five-layer clad material of Example 9, Cu-Mo composite layer: 25%Cu-Mo, density 9.31, total cold rolling reduction 95%
  Five-layer clad material of Example 10, Cu-Mo composite layer: 25%Cu-Mo, density 9.39, total cold rolling reduction 95%
- ■ Seven-layer clad material of Example 11, Cu-Mo composite layer: 25%Cu-Mo, density 9.30, total cold rolling reduction 95%
  Seven-layer clad material of Example 12, Cu-Mo composite layer: 25%Cu-Mo, density 9.38, total cold rolling reduction 95%
- ◆ Three-layer clad material of Example 17, Cu-Mo composite layer: 15%Cu-Mo, density 9.44, total warm rolling reduction 95%
  Three-layer clad material of Example 18, Cu-Mo composite layer: 15%Cu-Mo, density 9.31, total warm rolling reduction 96%
- ⊠ Three-layer clad material(*1) of Comparative Example 12,
  Cu-Mo composite layer: 25%Cu-Mo, density 9.30, total cold rolling reduction 95%
  Three-layer clad material(*1) of Comparative Example 13,
  Cu-Mo composite layer: 25%Cu-Mo, density 9.37, total cold rolling reduction 95%
- ○ Cu-Mo composite material alone of Comparative Example 14, 66%Cu-Mo, density 9.32, total cold rolling reduction 93.5%
- ▽ Cu-Mo composite material alone of Comparative Examples 15 to 18,
  59 to 61%Cu-Mo, density 9.39 to 9.41, total cold rolling reduction 93.5%
- □ Cu-Mo composite material alone of Comparative Examples 19 to 27,
  26 to 29%Cu-Mo, density 9.80 to 9.83, total cold rolling reduction 20 to 98%
  (*1: Three-layer clad material having clad structure in PTL 2)

FIG. 6

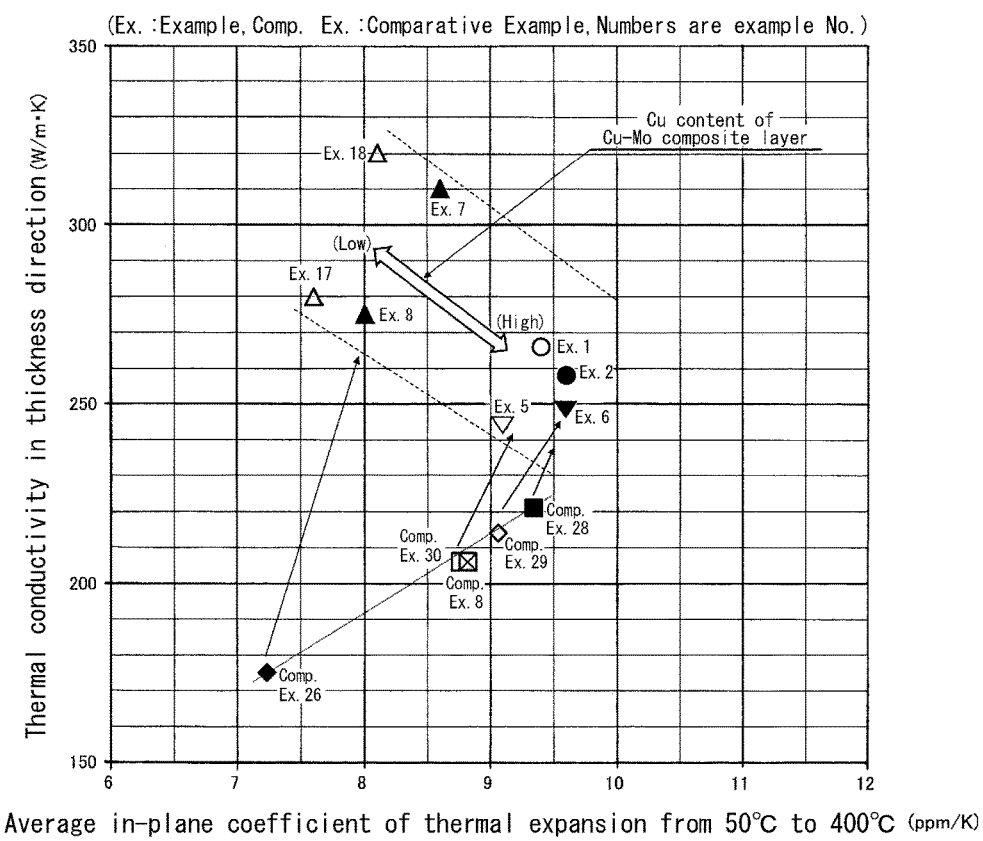

- ● Three-layer clad material of Example 2, Cu-Mo composite layer: 45%Cu-Mo, density 9.44, total cold rolling reduction 92%
- ▼ Three-layer clad material of Example 6, Cu-Mo composite layer: 44%Cu-Mo, density 9.44, total cold rolling reduction 92%
- ▽ Three-layer clad material of Example 5, Cu-Mo composite layer: 40%Cu-Mo, density 9.50, total cold rolling reduction 92%
- ○ Three-layer clad material of Example 1, Cu-Mo composite layer: 40%Cu-Mo, density 9.42, total cold rolling reduction 93.5%
- ▲ Three-layer clad material of Example 7, Cu-Mo composite layer: 25%Cu-Mo, density 9.33, total cold rolling reduction 95%
- Three-layer clad material of Example 8, Cu-Mo composite layer: 25%Cu-Mo, density 9.42, total cold rolling reduction 95%
- △ Three-layer clad material of Example 17, Cu-Mo composite layer: 15%Cu-Mo, density 9.44, total warm rolling reduction 95%
- Three-layer clad material of Example 18, Cu-Mo composite layer: 15%Cu-Mo, density 9.31, total warm rolling reduction 96%
- ■ Cu-Mo composite material alone of Comparative Example 28, 44%Cu-Mo, density 9.60, total cold rolling reduction 90%
- ◇ Cu-Mo composite material alone of Comparative Example 29, 44%Cu-Mo, density 9.60, total cold rolling reduction 93.5%
- ⊠ Cu-Mo composite material alone of Comparative Example 8, 40%Cu-Mo, density 9.65, total cold rolling reduction 90%
- □ Cu-Mo composite material alone of Comparative Example 30, 40%Cu-Mo, density 9.65, total cold rolling reduction 93.5%
- ◆ Cu-Mo composite material alone of Comparative Example 26, 26%Cu-Mo, density 9.83, total cold rolling reduction 95%

FIG. 8

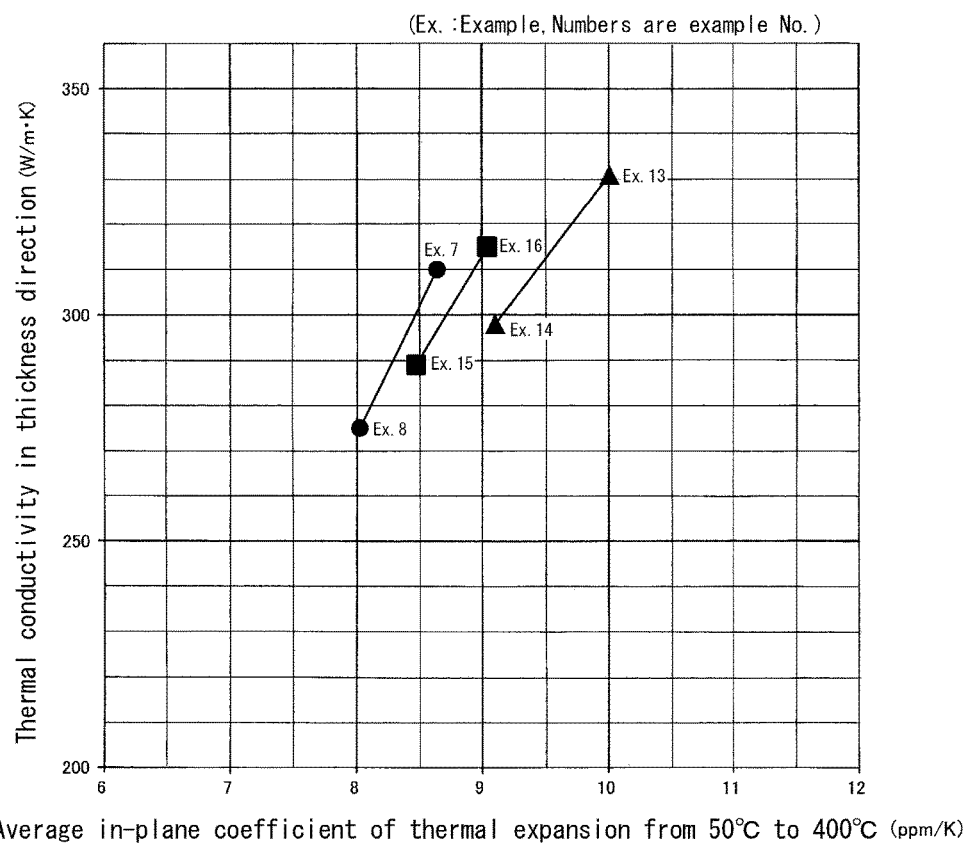

● Three-layer clad material of Example 7, Cu-Mo composite layer: 25%Cu-Mo, density 9.33, total cold rolling reduction 95%
  Three-layer clad material of Example 8, Cu-Mo composite layer: 25%Cu-Mo, density 9.42, total cold rolling reduction 95%
■ Three-layer clad material of Example 16, Cu-Mo composite layer: 25%Cu-Mo, density 9.30, total warm rolling reduction 98%
  Three-layer clad material of Example 15, Cu-Mo composite layer: 25%Cu-Mo, density 9.37, total warm rolling reduction 97.5%
▲ Three-layer clad material of Example 13, Cu-Mo composite layer: 25%Cu-Mo, density 9.29, total cold rolling reduction 70%
  Three-layer clad material of Example 14, Cu-Mo composite layer: 25%Cu-Mo, density 9.38, total cold rolling reduction 70%

HEAT SINK AND METHOD FOR MANUFACTURING SAME

TECHNICAL FIELD

The present disclosure relates to a heat sink used to efficiently dissipate heat generated from a heat generator such as a semiconductor element, and a method for manufacturing the same.

BACKGROUND

A heat sink is used to efficiently dissipate heat generated from a semiconductor element, from the semiconductor device. The heat sink is required to have high thermal (heat) conductivity for its function. Moreover, since the heat sink is bonded to a semiconductor, a ceramic circuit substrate, a metal package member, or the like by soldering or brazing, the heat sink is required to have a coefficient of thermal (heat) expansion (low coefficient of thermal expansion) close to that of the member to which the heat sink is bonded.

A Mo—Cu composite material has been conventionally used as a heat sink having high thermal conductivity and a low coefficient of thermal expansion (for example, JP H11-307701 A (PTL 1)). Typically, a Mo—Cu composite material used in a heat sink is manufactured by pressing a Mo powder or a mixed powder of a Mo powder and a Cu powder to obtain a green compact, optionally reducing sintering the green compact, and then subjecting it to Cu infiltration or densification to obtain a Mo—Cu composite material and rolling the Mo—Cu composite material. Mo hardly dissolves with Cu, so that the Mo—Cu composite material has a dual phase structure of Mo and Cu. A heat sink taking advantage of the property of Mo having a low coefficient of thermal expansion and the property of Cu having high thermal conductivity can thus be yielded.

JP 2001-358266 A (PTL 2) discloses, as a heat sink based on such a Mo—Cu composite material, a heat sink obtained by pressure joining Cu sheets to both sides of a Mo—Cu composite material yielded through a specific rolling process. According to PTL 2, this heat sink has higher thermal conductivity than a [Cu/Mo/Cu] clad material and also has excellent press blanking workability.

A Mo—Cu composite material is qualitatively known to decrease in coefficient of thermal expansion as a result of rolling. Hence, the Mo—Cu composite material is manufactured through the rolling process as mentioned above. Based on the conventional understanding that Mo particles resist deformation by rolling as Mo particles are hard and small as primary particles, warm rolling at about 200° C. to 400° C. is performed as the rolling of the Mo—Cu composite material (PTL 1). PTL 2 discloses a manufacturing method whereby warm rolling is performed as primary rolling and cold rolling is performed as secondary rolling. In this manufacturing method, too, warm rolling (primary rolling) is an essential step on the assumption that Mo particles resist deformation.

Higher-output semiconductor devices in recent years have made the heat-sink property of heat sinks more important. Meanwhile, the need for more compact semiconductor modules is high, and heat sinks are required to dissipate heat from a smaller area. Thus, the heat-sink property in the thickness direction is more important than the heat-sink property in the plane (i.e. surface) direction.

CITATION LIST

Patent Literatures

PTL 1: JP H11-307701 A
PTL 2: JP 2001-358266 A

SUMMARY

Technical Problem

Our studies revealed that the clad structure of the Mo—Cu composite material and the Cu material as described in PTL 2 does not have sufficiently improved thermal conductivity in the thickness direction, and there is an optimal clad structure having higher thermal conductivity in the thickness direction.

It could therefore be helpful to provide a heat sink that has a clad structure of a Mo—Cu composite material and a Cu material and has a low coefficient of thermal expansion and high thermal conductivity.

It could also be helpful to provide a method for manufacturing such a heat sink having excellent thermal properties stably at low cost.

Solution to Problem

The clad structure of the heat sink described in PTL 2 is a Cu/(Cu—Mo)/Cu structure. Our studies revealed that a (Cu—Mo)/Cu/(Cu—Mo) structure achieves higher thermal conductivity with approximately the same low coefficient of thermal expansion. Specifically, the (Cu—Mo)/Cu/(Cu—Mo) structure is at least 10 W/m·K higher in the thermal conductivity in the thickness direction than the Cu/(Cu—Mo)/Cu structure with the same Cu ratio and the same rolling reduction, and has even higher thermal conductivity in the thickness direction depending on conditions. When manufacturing a clad material of such a (Cu—Mo)/Cu/(Cu—Mo) structure, the coefficient of thermal expansion can be decreased more effectively by cold rolling the material at a high rolling reduction (total rolling reduction). Furthermore, by optimizing the Cu content in the Cu—Mo composite layer in the clad material of the (Cu—Mo)/Cu/(Cu—Mo) structure, high thermal conductivity and a low coefficient of thermal expansion can be highly achieved.

The present disclosure is based on these discoveries. We thus provide:

[1] A heat sink comprising a pair of Cu—Mo composite layers and a Cu layer stacked in a thickness direction so that the Cu layer is interposed between the Cu—Mo composite layers,
wherein each of the Cu—Mo composite layers has a thickness section microstructure in which flat Mo phase is dispersed in a Cu matrix.

[2] A heat sink comprising three or more Cu—Mo composite layers and two or more Cu layers alternately stacked in a thickness direction so that two of the Cu—Mo composite layers are outermost layers on both sides,
wherein each of the Cu—Mo composite layers has a thickness section microstructure in which flat Mo phase is dispersed in a Cu matrix.

[3] The heat sink according to [1] or [2], wherein each of the Cu—Mo composite layers has a Cu content of 10 mass % to 50 mass %.

[4] The heat sink according to [1] or [2], wherein each of the Cu—Mo composite layers has a Cu content of 20 mass % to 30 mass %.

[5] The heat sink according to any of [1] to [4], having a thermal conductivity in the thickness direction of 200 W/m·K or more and an average in-plane coefficient of thermal expansion from 50° C. to 800° C. of 10.0 ppm/K or less.

[6] The heat sink according to any of [1] to [4], having a thermal conductivity in the thickness direction of 250 W/m·K or more and an average in-plane coefficient of thermal expansion from 50° C. to 800° C. of 8.0 ppm/K or less.

[7] The heat sink according to any of [1] to [6], wherein a coating or plating is formed on one side or both sides of a heat sink body composed of the stacked Cu—Mo composite layers and one or more Cu layers, the coating or plating having a thickness with which thermal conductivity in the thickness direction is not lower than thermal conductivity in the thickness direction of the heat sink body by 10 W/m·K or more.

[8] A method for manufacturing the heat sink according to any of [1] to [6], the method comprising:

stacking a Cu—Mo composite material (a) having a thickness section microstructure in which Mo phase is dispersed in a Cu matrix and a Cu material (b);

diffusion bonding the stacked Cu—Mo composite material (a) and Cu material (b) to obtain a laminate; and thereafter subjecting the laminate to cold rolling (x), to obtain a heat sink in which Cu—Mo composite layers formed by the Cu—Mo composite material (a) and one or more Cu layers formed by the Cu material (b) are stacked.

[9] The method according to [8], wherein the Cu—Mo composite material (a) is obtainable by pressing a mixed powder of a Mo powder and a Cu powder to obtain a green compact, and sintering the green compact in a reducing atmosphere or in a vacuum to obtain a sintered body.

[10] The method according to [8], wherein the Cu—Mo composite material (a) is obtainable by pressing a mixed powder of a Mo powder and a Cu powder to obtain a green compact, sintering the green compact in a reducing atmosphere or in a vacuum to obtain a sintered body, and densifying the sintered body.

[11] The method according to [8], wherein the Cu—Mo composite material (a) is obtainable by pressing a Mo powder or a mixed powder of a Mo powder and a Cu powder to obtain a green compact, sintering the green compact in a reducing atmosphere or in a vacuum to obtain a sintered body, and impregnating the sintered body with Cu molten in a non-oxidizing atmosphere or in a vacuum.

[12] The method according to any of [8] to [11], wherein a rolling reduction in the cold rolling (x) is 70% to 99%.

[13] The method according to [12], wherein the rolling reduction in the cold rolling (x) is 90% to 96%.

[14] The method according to any of [8] to [13], wherein the cold rolling (x) is performed by cross-rolling.

[15] The method according to [8], wherein the Cu—Mo composite material (a) is obtainable by pressing a mixed powder of a Mo powder and a Cu powder to obtain a green compact, sintering the green compact in a reducing atmosphere or in a vacuum to obtain a sintered body, densifying the sintered body, and subjecting a resultant densified Cu—Mo composite material to rolling (y).

[16] The method according to [8], wherein the Cu—Mo composite material (a) is obtainable by pressing a Mo powder or a mixed powder of a Mo powder and a Cu powder to obtain a green compact, sintering the green compact in a reducing atmosphere or in a vacuum to obtain a sintered body, impregnating the sintered body with Cu molten in a non-oxidizing atmosphere or in a vacuum, and subjecting a resultant Cu—Mo composite material impregnated with Cu to rolling (y).

[17] The method according to [15] or [16], wherein a total rolling reduction of the Cu—Mo composite material (a) combining the cold rolling (x) and the rolling (y) is 70% to 99%.

[18] The method according to [17], wherein the total rolling reduction of the Cu—Mo composite material (a) combining the cold rolling (x) and the rolling (y) is 90% to 96%.

[19] The method according to any of [15] to [18], wherein the rolling (y) is performed by cross-rolling.

[20] The method according to any of [15] to [19], wherein in the case where the Cu—Mo composite material (a) is unidirectionally rolled in the rolling (y), in the cold rolling (x) the Cu—Mo composite material is rolled in a direction orthogonal to a rolling direction in the rolling (y).

[21] The method according to any of [8] to [20], wherein the Cu—Mo composite material (a) has a Cu content of 10 mass % to 50 mass %.

[22] The method according to any of [8] to [20], wherein the Cu—Mo composite material (a) has a Cu content of 20 mass % to 30 mass %.

[23] The method according to [21], wherein the Cu—Mo composite material (a) has a Cu content of less than 20 mass %, a total rolling reduction of the Cu—Mo composite material (a) combining the cold rolling (x) and optional rolling (y) is 70% or more, and the method comprises at least one of:

(1) performing warm rolling instead of the cold rolling (x); and (2) performing the rolling (y) by warm rolling.

[24] The method according to [22], wherein a total rolling reduction of the Cu—Mo composite material (a) combining the cold rolling (x) and optional rolling (y) is 96% or more, and the method comprises at least one of:

(1) performing warm rolling instead of the cold rolling (x); and (2) performing the rolling (y) by warm rolling.

[25] The method according to any of [8] to [24], comprising forming a coating or plating on one side or both sides of a heat sink body composed of the stacked Cu—Mo composite layers and one or more Cu layers, the coating or plating having a thickness with which thermal conductivity in the thickness direction is not lower than thermal conductivity in the thickness direction of the heat sink body by 10 W/m·K or more.

[26] A semiconductor package comprising the heat sink according to any of [1] to [7].

[27] A semiconductor module comprising the semiconductor package according to [26].

Advantageous Effect

The heat sink according to the present disclosure has excellent thermal properties such as a low coefficient of thermal expansion and high thermal conductivity. The manufacturing method according to the present disclosure can manufacture such a heat sink having excellent thermal properties stably at low cost.

BRIEF DESCRIPTION OF THE DRAWINGS

In the accompanying drawings:

FIG. 3 is a graph illustrating the thermal properties (the thermal conductivity in the thickness direction, the average in-plane coefficient of thermal expansion from 50° C. to 800° C.) of each heat sink in examples;

FIG. 6 is a graph illustrating the thermal properties (the thermal conductivity in the thickness direction, the average in-plane coefficient of thermal expansion from 50° C. to 400° C.) of each heat sink in examples;

FIG. 8 is a graph illustrating the thermal properties (the thermal conductivity in the thickness direction, the average in-plane coefficient of thermal expansion from 50° C. to 400° C.) of each heat sink with a different cold rolling reduction in manufacture in examples.

DETAILED DESCRIPTION

Figure 1:
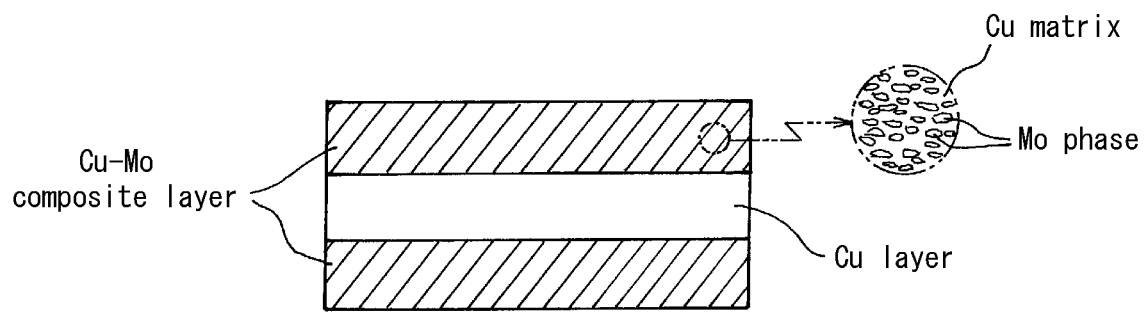
FIG. 1 is an explanatory diagram schematically illustrating a thickness section of a heat sink according to the present disclosure having a three-layer clad structure.

A heat sink according to the present disclosure having a three-layer clad structure is a heat sink comprising a pair of Cu—Mo composite layers and a Cu layer stacked in the thickness direction so that the Cu layer is interposed between the Cu—Mo composite layers, wherein each Cu—Mo composite layer has a thickness section microstructure in which flat Mo phase is dispersed in a Cu matrix. FIG. 1 schematically illustrates a thickness section of a heat sink according to the present disclosure having a three-layer clad structure.

Each Cu—Mo composite layer and the Cu layer in the heat sink according to the present disclosure are formed by diffusion bonding the stacked Cu—Mo composite material and Cu material, and have a diffusion bonded part therebetween. This diffusion bonded part is a sound diffusion bonded part because Cu (Cu in the Cu—Mo composite material and the Cu material) of both members are diffusion bonded. For example, in the case of cladding Mo (Mo material) and Cu (Cu material), both members are bonded not by diffusion bonding but by mechanical bonding because Mo and Cu are not alloyed. With such bonding, an oxide film or fine voids tend to remain at the bonded interface, and become origins of cracking and the like. According to the present disclosure, on the other hand, Cu (Cu in the Cu—Mo composite material and the Cu material) of both members are diffusion bonded, so that a sound bonded part is obtained without an oxide film or fine voids remaining at the bonded interface.

Figure 2:
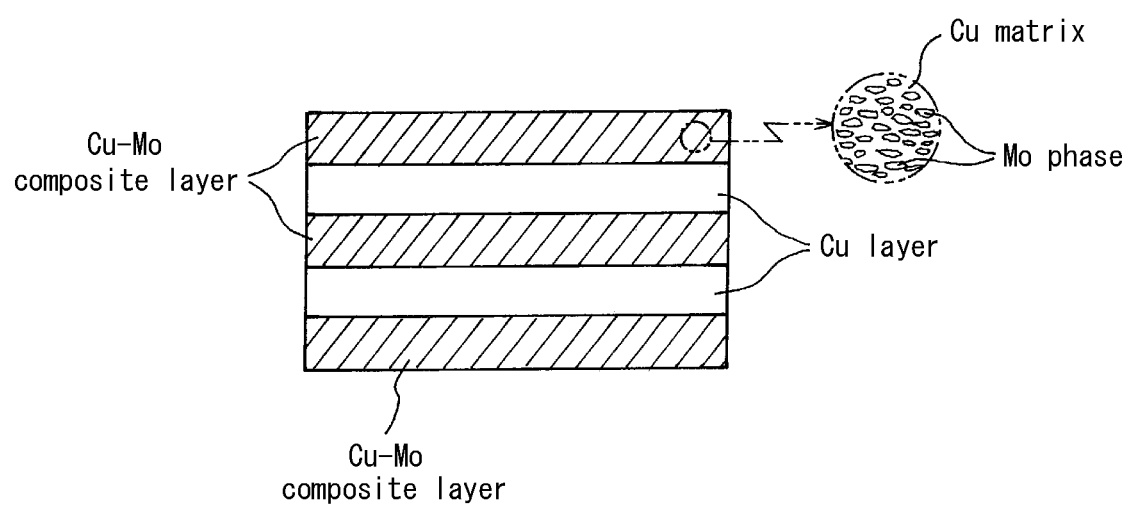
FIG. 2 is an explanatory diagram schematically illustrating a thickness section of a heat sink according to the present disclosure having a five-layer clad structure.

The heat sink according to the present disclosure may have a clad structure of five layers or more. The heat sink having a clad structure of five layers or more is a heat sink comprising three or more Cu—Mo composite layers and two or more Cu layers alternately stacked in the thickness direction so that two of the Cu—Mo composite layers are the outermost layers on both sides, wherein each Cu—Mo composite layer has a thickness section microstructure in which flat Mo phase is dispersed in a Cu matrix. FIG. 2 schematically illustrates a thickness section of the heat sink according to the present disclosure having a five-layer clad structure.

Such a heat sink according to the present disclosure in which both outermost layers are Cu—Mo composite layers (e.g. heat sink having the (Cu—Mo)/Cu/(Cu—Mo) structure) has higher thermal conductivity than the heat sink having the Cu/(Cu—Mo)/Cu structure described in PTL 2. This can be attributed to the following difference in functional effects between the two structures. In the Cu/(Cu—Mo)/Cu structure in PTL 2, thermal conductivity is higher in the outer layer (Cu layer) than in the inner layer (Cu—Mo composite layer), so that the thermal resistance at the interface between the outer layer and the inner layer is high. Hence, heat that has entered the outer layer (Cu layer) reflects/scatters at the interface between the outer layer and the inner layer, and thus the heat flow is disturbed. As a result, the heat cannot be transferred to the inner layer (Cu—Mo composite layer) effectively, and the thermal conductivity in the thickness direction decreases. In the (Cu—Mo)/Cu/(Cu—Mo) structure according to the present disclosure, on the other hand, thermal conductivity is higher in the inner layer (Cu layer) than in the outer layer (Cu—Mo composite layer), so that there is little thermal resistance at the interface between the outer layer and the inner layer. Hence, heat that has entered the outer layer (Cu—Mo composite layer) is transferred to the inner layer (Cu layer) effectively. High thermal conductivity in the thickness direction can thus be achieved.

The number of layers in the clad structure is not limited. A larger number of layers contributes to a lower coefficient of thermal expansion, and also contributes to better press workability and thus is advantageous in press working. However, the thermal conductivity in the thickness direction tends to decrease to some extent with an increase in the number of layers. Therefore, the practical upper limit of the total number of layers is about 11.

The Cu content in the Cu—Mo composite layer is not limited, but is typically about 10 mass % to 50 mass %. As described later, with relatively high Cu content (e.g. 40 mass % or more), cold rollability increases in the case where cold rolling is performed at a high rolling reduction, and thus the effect of decreasing the coefficient of thermal expansion by cold rolling at a high rolling reduction is enhanced. Meanwhile, in terms of enhancing the effect of restraining the thermal expansion of the Cu layer (the effect of physically restraining the Cu layer by sandwiching it from both sides), not only higher rolling reduction in the rolling but also higher Mo content is preferable. However, Mo content is in a tradeoff relationship with thermal conductivity. Besides, excessively high Mo content makes cold rolling difficult. Therefore, in terms of workability such as cold rollability, the Cu content is preferably about 30 mass % to 45 mass %. In terms of the thermal properties of the heat sink, the Cu content in the Cu—Mo composite layer is preferably about 15 mass % to 30 mass %, with which excellent thermal properties with highly satisfactory high thermal conductivity and low coefficient of thermal expansion can be achieved.

Therefore, in terms of the thermal properties of the heat sink, the Cu content in the Cu—Mo composite layer is preferably about 15 mass % to 30 mass %. If the Cu content in the Cu—Mo composite layer (Cu—Mo composite material) is less than 20 mass %, cold rollability may be impaired. Hence, in terms of the thermal properties and cold rollability of the heat sink, the Cu content in the Cu—Mo composite layer is more preferably about 20 mass % to 30 mass %.

Figure 4:
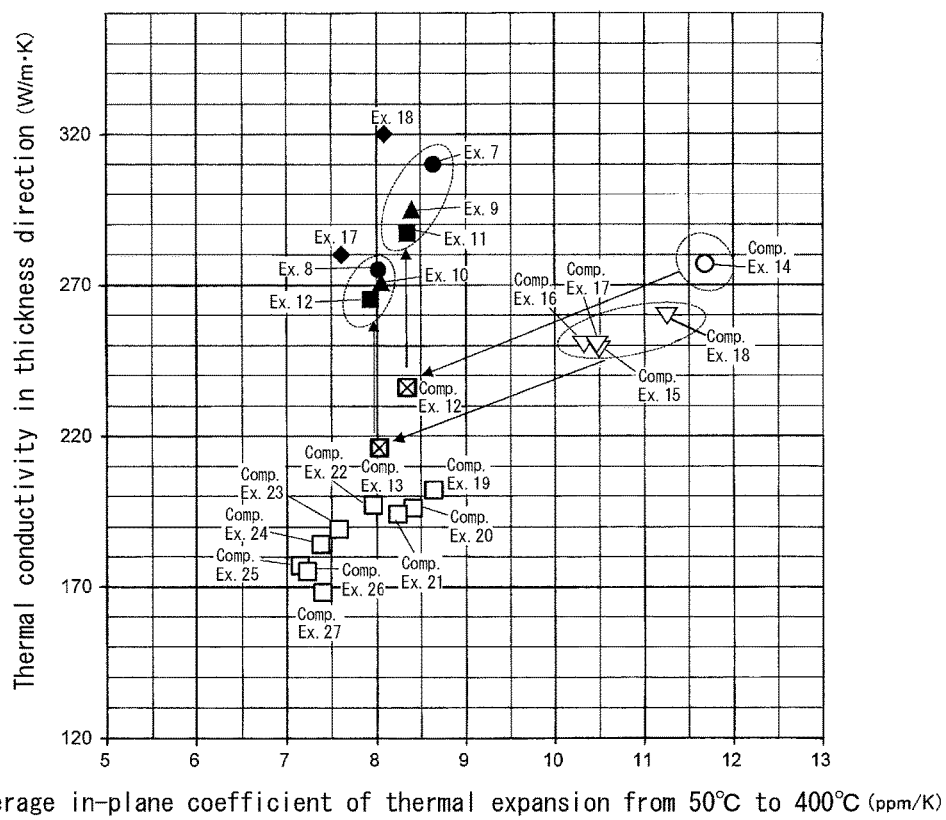
FIG. 4 is a graph illustrating the thermal properties (the thermal conductivity in the thickness direction, the average in-plane coefficient of thermal expansion from 50° C. to 400° C.) of each heat sink in examples.

FIGS. 3 and 4 illustrate the thermal properties of some heat sinks in the below-described examples in an organized manner. FIG. 3 illustrates the thermal conductivity in the thickness direction (thermal conductivity at room temperature) and the average in-plane coefficient of thermal expansion from 50° C. to 800° C. FIG. 4 illustrates the thermal conductivity in the thickness direction (thermal conductivity at room temperature) and the average in-plane coefficient of thermal expansion from 50° C. to 400° C. The in-plane coefficient of thermal expansion was measured by a push-rod-type displacement detection method. The difference in elongation between 50° C. and 800° C. and the difference in elongation between 50° C. and 400° C. were each divided by the temperature difference, to calculate the average in-plane coefficient of thermal expansion from 50° C. to 800° C. and the average in-plane coefficient of thermal expansion from 50° C. to 400° C. In addition, the thermal conductivity in the thickness direction (thermal conductivity at room temperature) was measured by a flash method. These thermal property measurement/calculation methods also apply to the thermal properties in FIGS. 5 to 8 described later.

FIGS. 3 and 4 illustrate the thermal properties of each heat sink composed only of a Cu—Mo composite material (Comparative Example), each heat sink composed of a three-layer clad material of Cu/(Cu—Mo)/Cu structure in PTL 2 (Comparative Example), and each heat sink composed of a three- to seven-layer clad material according to the present disclosure (Example). In the drawings, heat sinks having approximately equal density are encircled and connected by arrows. As can be understood from the comparison of the thermal properties of heat sinks having approximately equal density, the heat sink of Cu/(Cu—Mo)/Cu structure in PTL 2 has slightly lower thermal conductivity in the thickness direction than the heat sink composed only of Cu—Mo composite material, and a significantly lower in-plane coefficient of thermal expansion than the heat sink composed only of Cu—Mo composite material. The heat sink according to the present disclosure has approximately the same in-plane coefficient of thermal expansion as the heat sink of Cu/(Cu—Mo)/Cu structure, but considerably higher thermal conductivity in the thickness direction than the heat sink of Cu/(Cu—Mo)/Cu structure (about 50 W/m·K to 70 W/m·K higher in this example).

Figure 5:
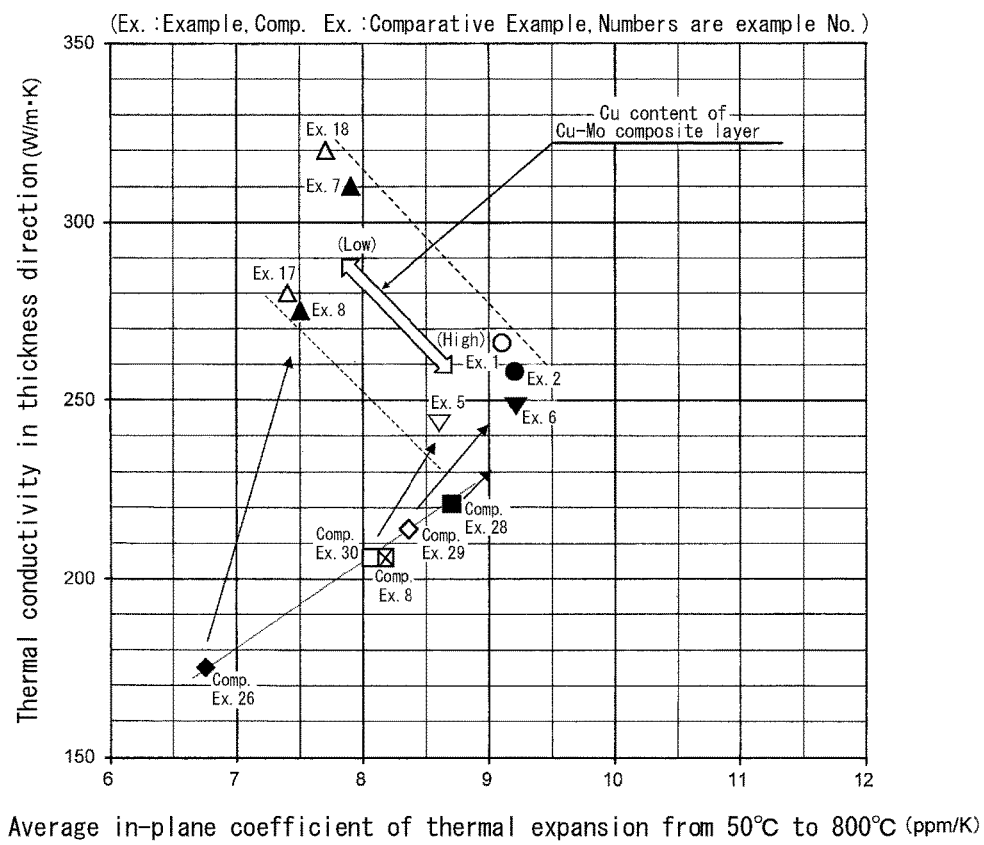
FIG. 5 is a graph illustrating the thermal properties (the thermal conductivity in the thickness direction, the average in-plane coefficient of thermal expansion from 50° C. to 800° C.) of each heat sink in examples.

FIGS. 5 and 6 illustrate the influence of the Cu content in the Cu—Mo composite layer on the thermal properties of the heat sink according to the present disclosure. FIGS. 5 and 6 illustrate the thermal properties of some heat sinks (three-layer clad material of Example) in the below-described examples. FIG. 5 illustrates the thermal conductivity in the thickness direction (thermal conductivity at room temperature) and the average in-plane coefficient of thermal expansion from 50° C. to 800° C. FIG. 6 illustrates the thermal conductivity in the thickness direction (thermal conductivity at room temperature) and the average in-plane coefficient of thermal expansion from 50° C. to 400° C. FIGS. 5 and 6 also illustrate the thermal properties of each heat sink (Comparative Example) composed only of a Cu—Mo composite having approximately the same Cu content as the heat sink of Example. In the drawings, "heat sink composed only of a Cu—Mo composite" and "heat sink of Example" having approximately the same Cu content in the Cu—Mo composite are connected by solid arrows.

As illustrated in FIGS. 5 and 6, when the Cu content in the Cu—Mo composite layer is lower (the Mo content is higher) in a range of 15 mass % to 45 mass %, the heat sink of Example has higher thermal conductivity in the thickness direction and a lower average in-plane coefficient of thermal expansion. Since cold rollability decreases when the Cu content in the Cu—Mo composite layer (Cu—Mo composite material) is less than 20 mass % as described later, each heat sink having a Cu content in the Cu—Mo composite layer of 15 mass % was manufactured by warm rolling. The thermal conductivity in the thickness direction of the heat sink of Example is considerably higher than the thermal conductivity in the thickness direction of the heat sink (Comparative Example) composed only of a Cu—Mo composite having approximately the same Cu content as the heat sink of Example, and their difference is particularly obvious in the case where the Cu content in the Cu—Mo composite is relatively low (15 mass %, 25 mass %). The results in FIGS. 5 and 6 suggest that particularly good thermal properties are achieved in the case where the Cu content in the Cu—Mo composite layer is 15 mass % to 30 mass % (20 mass % to 30 mass % when cold rollability is also taken into account).

The respective thicknesses of the Cu—Mo composite layer and the Cu layer, the layer thickness ratio between the Cu—Mo composite layer and the Cu layer, the thickness of the heat sink, etc. are not limited. In the case of a multilayer clad material of five layers or more (in particular, seven layers or more), the plurality of Cu layers preferably have the same thickness, in order to increase the restraining force for the Cu layers by the Cu—Mo composite layers. Moreover, in the case of a multilayer clad material of five layers or more, its structure is preferably symmetric in the thickness direction with respect to the center Cu—Mo composite layer in the thickness direction (i.e. symmetric in the thicknesses of the Cu—Mo composite layer and the Cu layer), in order to ensure thermal properties and also prevent deflection, strain, and the like during rolling or during use. The thickness of the heat sink is not limited, but is typically about 1 mm.

Regarding the layer thickness ratio between the Cu—Mo composite layer and the Cu layer, if the layer thickness ratio of the Cu layer to the Cu—Mo composite layer is high, the restraint of the Cu layer by the Cu—Mo composite layer is weak, and the coefficient of thermal expansion is high. If the layer thickness ratio of the Cu layer is low, the thermal conductivity is low. The layer thickness ratio between the Cu—Mo composite layer and the Cu layer may be selected as appropriate depending on desired thermal properties. In terms of reducing the coefficient of thermal expansion at low temperature (e.g. 200° C., 400° C.), it is desirable not to significantly increase the thickness of the Cu layer relative to the Cu—Mo composite layer.

The Cu content in the Cu—Mo composite layer and the layer thickness ratio between the Cu—Mo composite layer and the Cu layer are linked to the density of the heat sink. Accordingly, the density is preferably about 9.25 g/cm$^3$ to 9.55 g/cm$^3$, and particularly preferably about 9.30 g/cm$^3$ to 9.45 g/cm$^3$.

The heat sink according to the present disclosure is manufactured by diffusion bonding and then rolling a Cu—Mo composite material and a Cu material produced beforehand. Since rolling may also be performed in the Cu—Mo composite material manufacturing process, the heat sink as a whole has a rolled microstructure. Moreover, the Mo phase dispersed in the Cu matrix in the Cu—Mo composite layer is stretched flat, and the aspect ratio (aspect ratio in the rolling direction) of the Mo phase in the thickness section microstructure is typically more than 2. The aspect ratio (aspect ratio in the rolling direction) is more preferably 3 or more, because the coefficient of thermal expansion decreases as a result of the Mo phase being flattened by rolling (in particular, cold rolling).

The aspect ratio herein is the major axis/minor axis (length ratio) of the Mo phase in the thickness section microstructure in the rolling direction. In the present disclosure, the thickness section microstructure (ion-milling-finished thickness section microstructure) in the rolling direction is observed by an SEM, the major axis/minor axis of each particle of the Mo phase included in any one observation field is calculated, and their average value is taken to be the "aspect ratio of the Mo phase in the thickness section microstructure". In the case where the Cu—Mo composite layer has undergone rolling in directions (X-axis direction and Y-axis direction) orthogonal to each other in the heat sink plane (surface), it is preferable that the aspect ratio in each of the two rolling directions satisfies the foregoing condition.

The Mo phase dispersed in the Cu matrix in the Cu—Mo composite layer has a different flat-stretched form depending on, for example, the Mo content and the rolling type (unidirectional rolling, cross-rolling) of the Cu—Mo composite layer. For example, in the case where the Mo content in the Cu—Mo composite layer is relatively low, the flat-stretched Mo phase has a pattern similar to islands separated from each other. In the case where the Mo content is high, the particles of the flat-stretched Mo phase connect to each other, creating a form (rolled microstructure) like a striped or marble pattern in which such Mo phase is mixed with the Cu matrix. In the latter case, the aspect ratio may be unable to be specifically quantified although it is clearly more than 2.

A semiconductor package in which the heat sink according to the present disclosure is mainly used is repeatedly heated from normal temperature (which may be about −50° C. in cold climates) to about 200° C. during semiconductor operation, as the semiconductor repeats operation and pause. To suppress thermal fatigue, the heat sink needs to have a low coefficient of thermal expansion. It is important that the coefficient of thermal expansion is low up to about 800° C. in applications involving brazing bonding, and up to about 400° C. in applications involving soldering bonding. Meanwhile, the heat sink needs to have high thermal conductivity especially in the thickness direction, in order to achieve high heat-sink property.

The heat sink according to the present disclosure has excellent thermal properties including both high thermal conductivity and a low coefficient of thermal expansion. Specifically, the thermal conductivity in the thickness direction (thermal conductivity at room temperature) is preferably 200 W/m·K or more, more preferably 250 W/m·K or more, and particularly preferably 260 W/m·K or more. The average in-plane coefficient of thermal expansion from 50° C. to 800° C. is preferably 10.0 ppm/K or less, more preferably 8.0 ppm/K or less, and particularly preferably 7.5 ppm/K or less.

In a semiconductor package in which the heat sink according to the present disclosure is mainly used, the heat sink is bonded to a ceramic substrate such as an alumina substrate. In conventional Si semiconductor packages, heat sinks of about 220 W/m·K have been used. The heat sink according to the present disclosure, on the other hand, particularly preferably has thermal properties of 260 W/m·K or more in the thermal conductivity in the thickness direction (thermal conductivity at room temperature) and 7.5 ppm/K or less in the average in-plane coefficient of thermal expansion from 50° C. to 800° C., to support for high-output semiconductors such as SiC semiconductor and GaN semiconductor. Such excellent thermal properties can be easily obtained particularly in the case where the Cu content in the Cu—Mo composite layer is 20 mass % to 30 mass %.

The heat sink according to the present disclosure may have a coating or plating such as a Ni coating or plating on its surface, for corrosion protection or for bonding (brazing bonding or soldering bonding) to another member. This coating or plating is formed with such a thickness that does not significantly affect the thermal properties of the heat sink. The type of the coating or plating is not limited. Examples include a Ni coating or plating, a Cu coating or plating, a Au coating or plating, and a Ag coating or plating. These coatings or platings may be used singly or in combination of two or more layers. The coating or plating may be formed on only one side of the heat sink (i.e. on the surface of one of the two Cu—Mo composite layers which are the outermost layers), or on both sides of the heat sink. To improve coatability or platability when forming the coating or plating such as a Ni coating or plating on the heat sink surface, a Cu film (e.g. coating or plating) with such a thickness (e.g. a thickness of about several μm) that does not affect the thermal properties may be formed on the heat sink surface (the surfaces of the Cu—Mo composite layers which are the outermost layers).

The coating or plating needs to be formed with such a thickness that does not significantly affect the thermal properties of the heat sink body composed of the Cu—Mo composite layers and the Cu layer(s). Specifically, given that a thicker coating or plating typically causes lower thermal conductivity in the thickness direction, the thickness of the coating or plating is preferably such that the thermal conductivity in the thickness direction is not lower than that of the heat sink body (the heat sink without the coating or plating) by 10 W/m·K or more. For example, in the case where the coating or plating is a Cu coating or plating, its thickness is preferably 20 μm or less.

A method for manufacturing the above-described heat sink according to the present disclosure will be described below.

In one embodiment of the method for manufacturing the heat sink according to the present disclosure, a Cu—Mo composite material (a) having a thickness section microstructure in which Mo phase is dispersed in a Cu matrix and a Cu material (b) are stacked, and the stacked Cu—Mo composite material (a) and Cu material (b) are diffusion bonded to obtain a laminate, and then the laminate is subjected to cold rolling (x) to obtain a heat sink in which Cu—Mo composite layers formed by the Cu—Mo composite material (a) and one or more Cu layers formed by the Cu material (b) are stacked. Here, the Cu—Mo composite material (a) is produced beforehand. The Cu—Mo composite material (a) may be produced by a method (e.g. any of the below-described methods (i) to (iii)) not involving rolling, or produced by a method (e.g. the below-described method (iv) or (v)) involving rolling (y).

In another embodiment of the method for manufacturing the heat sink according to the present disclosure, in the case where the Cu content in the Cu—Mo composite material (a) is relatively low, warm rolling of the following (1) and/or (2)

is performed to prevent, for example, edge cracks caused by cold rolling. These manufacturing methods will be described in detail later.

(1) Perform warm rolling instead of cold rolling (x).
(2) Perform rolling (y) by warm rolling.

The thicknesses of the Cu—Mo composite material (a) and the Cu material (b) are selected depending on the thicknesses of the Cu—Mo composite layer and the Cu layer of the heat sink to be manufactured. Hence, Cu foil may be used as the Cu material (b) depending on the thickness of the Cu layer.

The Cu—Mo composite material (a) may be composed of a plurality of thin layers of Cu—Mo composite material stacked together. The Cu material (b) may be composed of a plurality of thin layers of Cu material stacked together. In such a case, the laminate is formed by diffusion bonding any of: (1) the stacked Cu—Mo composite material (a) composed of a plurality of layers of Cu—Mo composite material and Cu material (b) alone; (2) the stacked Cu—Mo composite material (a) alone and Cu material (b) composed of a plurality of layers of Cu material; and (3) the stacked Cu—Mo composite material (a) composed of a plurality of layers of Cu—Mo composite material and Cu material (b) composed of a plurality of layers of Cu material.

The method of diffusion bonding the stacked Cu—Mo composite material (a) and Cu material (b) is not limited, but diffusion bonding is preferably performed by spark plasma sintering (SPS) or hot pressing.

As the Cu—Mo composite material (a), any of the below-described materials may be used. As the Cu material (b), a pure Cu sheet (such as pure Cu foil) is typically used.

As mentioned earlier, a Cu—Mo composite material is qualitatively known to decrease in coefficient of thermal expansion as a result of rolling. Hence, conventional techniques involve rolling the Cu—Mo composite material. It is considered that Mo particles resist deformation by rolling as Mo particles are hard and small as primary particles. Accordingly, warm rolling at about 200° C. to 400° C. is solely employed as the rolling of the Cu—Mo composite material. While some proposed methods use cold rolling in secondary rolling of a 65 mass % Mo-35 mass % Cu composite material, the method uses warm rolling in primary rolling.

However, regarding such conventional recognition and manufacturing methods based on the recognition, we discovered the following: If a Cu—Mo composite material (in particular, a Cu—Mo composite material whose Cu content is not relatively low) is rolled by warm rolling, the effect of decreasing the coefficient of thermal expansion is low because the deformation of Mo particles does not progress appropriately. If the Cu—Mo composite material is rolled by cold rolling, on the other hand, the deformation of Mo particles progresses appropriately and the coefficient of thermal expansion is decreased effectively. In the case where the Cu content in the Cu—Mo composite material is relatively low (e.g. less than 20 mass %), cold rolling causes edge cracks and the like depending on the rolling reduction, so that it may be preferable to perform the whole or part of the rolling by warm rolling. In the case where the Cu content is 20 mass % or more (in particular, 25 mass % or more) and the rolling reduction is not extremely high, a favorable rolled sheet can be obtained without significant edge cracks by rolling the Cu—Mo composite material only by cold rolling. The reason why the plastic deformation form of Mo particles greatly differs between warm rolling and cold rolling is considered as follows.

In the case of rolling the Cu—Mo composite material, there is tendency that, due to the difference in yield stress between Mo and Cu, Mo particles change in relative position in the Cu matrix rather than deforming in the initial stage of the rolling, and deform as the rolling progresses and the Mo particles come into contact with each other in the thickness direction. With cold rolling, Cu undergoes work hardening, so that Mo particles can be deformed by Cu phase as the rolling progresses. This enables the deformation of Mo particles to progress appropriately. With warm rolling, on the other hand, Mo particles change in relative position in the Cu matrix more easily, and Cu is unlikely to be work hardened. Accordingly, the effect of deforming Mo particles by Cu phase is insufficient as compared with cold rolling, and the deformation of Mo particles does not progress appropriately.

This difference in the plastic deformation form of Mo particles in the Cu—Mo composite material is more obvious when the Cu content in the Cu—Mo composite material is higher. The reason for this is considered as follows. With warm rolling, work hardening of Cu cannot be used, and also Mo particles easily change in relative position in the Cu matrix because of high Cu content. With cold rolling, the influence of work hardening of Cu is higher because of high Cu content. Cu not only has high thermal conductivity but also has a high coefficient of thermal expansion. Therefore, higher Cu content in the Cu—Mo composite material is likely to cause a problem in terms of the coefficient of thermal expansion. However, the coefficient of thermal expansion of the Cu—Mo composite material can be effectively decreased by performing cold rolling at a predetermined high rolling reduction. Moreover, even in the case where warm rolling is employed as part of the rolling so as to use cold rolling and warm rolling in combination as described later, the cold rolling is expected to have an effect of decreasing the coefficient of thermal expansion.

Even in the case where the Cu content in the Cu—Mo composite material is relatively low (e.g. Cu content of 30 mass % or less), the same effect as above can be achieved although to a lesser degree. In the case where the Cu content in the Cu—Mo composite material is relatively low, the restraint by Mo is enhanced as mentioned earlier, which is expected to have an effect of decreasing the coefficient of thermal expansion.

The Cu—Mo composite material (a) is produced beforehand. As the Cu—Mo composite material (a), for example, a Cu—Mo composite material obtainable by any of the following methods (i) to (iii) may be used.

(i) Cu—Mo composite material (a) obtainable by pressing a mixed powder of a Mo powder and a Cu powder to obtain a green compact, and sintering the green compact in a reducing atmosphere or in a vacuum to obtain a sintered body.

(ii) Cu—Mo composite material (a) obtainable by pressing a mixed powder of a Mo powder and a Cu powder to obtain a green compact, sintering the green compact in a reducing atmosphere or in a vacuum to obtain a sintered body, and densifying the sintered body.

(iii) Cu—Mo composite material (a) obtainable by pressing a Mo powder or a mixed powder of a Mo powder and a Cu powder to obtain a green compact, sintering the green compact in a reducing atmosphere or in a vacuum to obtain a sintered body, and impregnating the sintered body with Cu molten in a non-oxidizing atmosphere or in a vacuum.

Since the Cu—Mo composite material (a) obtained by any of these methods (i) to (iii) has not been cold rolled, the cold rolling (x) of the clad material is preferably performed at a rolling reduction of 70% to 99%, more preferably performed at a rolling reduction of 80% to 99%, and particularly preferably performed at a rolling reduction of 90% to 96%. This rolling reduction is also the rolling reduction of the Cu—Mo composite material (a). As a result of performing cold rolling at a high rolling reduction, the effect of decreasing the coefficient of thermal expansion can be achieved. If the rolling reduction is excessively high, the thermal conductivity tends to decrease. Accordingly, the upper limit of the rolling reduction is 99%, and is preferably 96%. Thus, the coefficient of thermal expansion can be decreased effectively while suppressing a decrease in thermal conductivity. The cold rolling (x) is performed in a plurality of passes.

The cold rolling (x) may be unidirectional rolling. Alternatively, the cold rolling (x) may be cross-rolling, i.e. rolling in two directions orthogonal to each other, in order to reduce the difference in the coefficient of thermal expansion between two directions (X-axis direction and Y-axis direction) orthogonal to each other in the heat sink plane and reduce in-plane anisotropy. Different rolling reductions may be used in the rolling in the two orthogonal directions. To obtain a rolled sheet having uniform thermal properties with no difference in the coefficient of thermal expansion between the X-axis direction and the Y-axis direction, however, it is preferable to use the same rolling reduction.

As the Cu—Mo composite material (a), a Cu—Mo composite material obtainable by the following method (iv) or (v) may be used.

(iv) Cu—Mo composite material (a) obtainable by pressing a mixed powder of a Mo powder and a Cu powder to obtain a green compact, sintering the green compact in a reducing atmosphere or in a vacuum to obtain a sintered body, densifying the sintered body, and subjecting the resultant densified Cu—Mo composite material to rolling (y).

(v) Cu—Mo composite material (a) obtainable by pressing a Mo powder or a mixed powder of a Mo powder and a Cu powder to obtain a green compact, sintering the green compact in a reducing atmosphere or in a vacuum to obtain a sintered body, impregnating the sintered body with Cu molten in a non-oxidizing atmosphere or in a vacuum, and subjecting the resultant Cu—Mo composite material impregnated with Cu to rolling (y).

The rolling (y) may be performed by cold rolling. Even in the case where the Cu content in the Cu—Mo composite material (a) is less than 40 mass % (in particular, 30 mass % or less), the rolling (y) may be performed by cold rolling. Alternatively, the rolling (y) may be performed by warm rolling depending on circumstances. The rolling (y) may be unidirectional rolling. Alternatively, the rolling (y) may be cross-rolling, i.e. rolling in two directions orthogonal to each other, in order to reduce the difference in the coefficient of thermal expansion between two directions (X-axis direction and Y-axis direction) orthogonal to each other in the heat sink plane and reduce in-plane anisotropy. Different rolling reductions may be used in the rolling in the two orthogonal directions. To obtain a Cu—Mo composite material (a) having uniform thermal properties with no difference in the coefficient of thermal expansion between the X-axis direction and the Y-axis direction, however, it is preferable to use the same rolling reduction.

Since the Cu—Mo composite material (a) obtained by the method (iv) or (v) has been subjected to the rolling (y), the cold rolling (x) of the clad material is preferably performed at such a rolling reduction that the total rolling reduction of the Cu—Mo composite material (a) combining the cold rolling (x) and the rolling (y) is 70% to 99%, more preferably performed at such a rolling reduction that the total rolling reduction is 80% to 99%, and particularly preferably performed at such a rolling reduction that the total rolling reduction is 90% to 96%. The reason for this is the same as the above. In the case where the Cu—Mo composite material (a) is unidirectionally rolled in the rolling (y), in the cold rolling (x) the Cu—Mo composite material may be rolled in a direction orthogonal to the rolling direction in the rolling (y).

Figure 7:
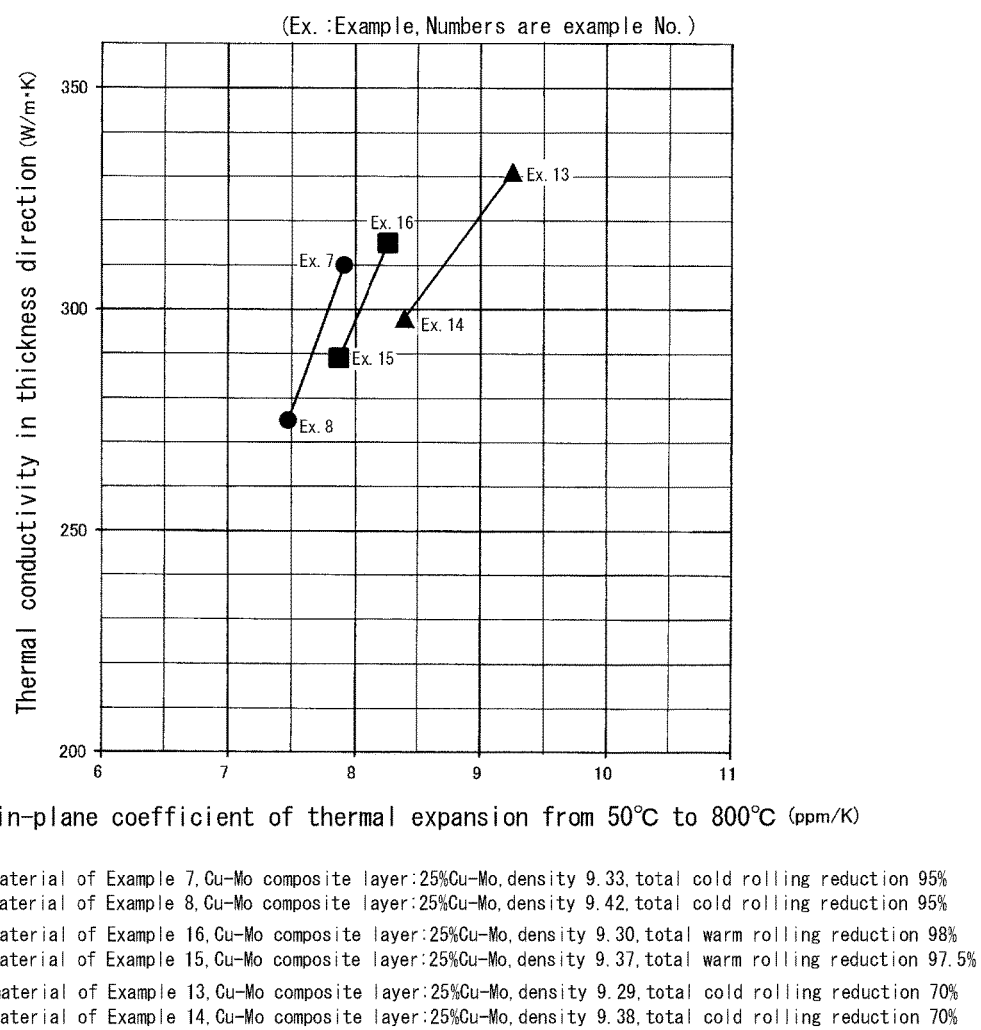
FIG. 7 is a graph illustrating the thermal properties (the thermal conductivity in the thickness direction, the average in-plane coefficient of thermal expansion from 50° C. to 800° C.) of each heat sink with a different cold rolling reduction in manufacture in examples.

FIGS. 7 and 8 illustrate the thermal properties of heat sinks in the below-described examples different in the rolling reduction in cold rolling in the manufacture, in an organized manner. FIG. 7 illustrates the thermal conductivity in the thickness direction (thermal conductivity at room temperature) and the average in-plane coefficient of thermal expansion from 50° C. to 800° C. FIG. 8 illustrates the thermal conductivity in the thickness direction (thermal conductivity at room temperature) and the average in-plane coefficient of thermal expansion from 50° C. to 400° C. The rolling reduction (70% to 98%) in cold rolling herein is the total rolling reduction of the rolling reduction of the Cu—Mo composite material alone and the rolling reduction of the Cu—Mo composite material in clad material rolling.

In the manufacture of the heat sink according to the present disclosure, in the case where the Cu content in the Cu—Mo composite material (a) is relatively low, a manufacturing method involving warm rolling (including a manufacturing method that does not perform the rolling (y) on the Cu—Mo composite material (a)) is preferably used to prevent, for example, edge cracks caused by cold rolling, although depending on the total rolling reduction of the material. In this manufacturing method, for example, warm rolling is preferably performed under the following conditions.

In the case where the total rolling reduction of the material (the total rolling reduction of the rolling reduction of the Cu—Mo composite material alone and the rolling reduction of the Cu—Mo composite material in clad material rolling) is 70% or more and the Cu content in the Cu—Mo composite material (a) is less than 20 mass %, it is preferable to perform warm rolling of the following (1) and/or (2). Particularly in the case where the Cu content is 15 mass % or less, it is preferable to perform warm rolling of the following (1) and (2). In the case where the Cu content in the Cu—Mo composite material (a) is 20 mass % to 30 mass % and the total rolling reduction of the material is particularly high (e.g. total rolling reduction of 96% or more), too, it is preferable to perform warm rolling of the following (1) and/or (2).

(1) Perform warm rolling instead of the cold rolling (x).
(2) Perform the rolling (y) by warm rolling.

As mentioned earlier, with warm rolling, Mo particles change in relative position in the Cu matrix more easily, and Cu is unlikely to be work hardened. Accordingly, the effect of deforming Mo particles by Cu phase is insufficient as compared with cold rolling, and the proportion of decrease of the coefficient of thermal expansion by rolling tends to be lower than that by cold rolling. In the case where the Cu content in the Cu—Mo composite material is low, however, the relative position change of Cu phase and Mo particles is unlikely to occur because the distance between Mo particles is shorter, and Mo particles are deformed easily. Performing warm rolling in such conditions can yield a heat sink having thermal properties not significantly different from those in the case of performing cold rolling.

The warm rolling is preferably performed at a temperature of about 200° C. to 300° C. If the temperature of the warm rolling is more than 300° C., Mo oxidizes, which facilitates the formation of surface oxide. Such surface oxide tends to exfoliate during the rolling and adversely affect the quality of the product.

In the case of performing warm rolling of either (1) or (2), one of (1) and (2) is selected based on rollability depending on the Cu content, thickness, and the like of the Cu—Mo composite material (a).

The steps in the methods (i) to (v) for obtaining the Cu—Mo composite material (a) will be described below.

Hereafter, a step of pressing a Mo powder or a mixed powder of a Mo powder and a Cu powder to obtain a green compact is referred to as step (A), a step of sintering the green compact in a reducing atmosphere or in a vacuum to obtain a sintered body is referred to as step (B), a step of impregnating the sintered body with Cu molten in a non-oxidizing atmosphere or in a vacuum is referred to as step (C1), a step of densifying the sintered body is referred to as step (C2), and a step of subjecting the Cu-infiltrated or densified Cu—Mo composite material to rolling (y) is referred to as step (D).

In step (A), a Mo powder or a mixed powder of a Mo powder and a Cu powder is pressed to obtain a green compact according to a conventional method. The above-described methods of manufacturing the Cu—Mo composite material (a) include the case where Cu infiltration is performed after sintering the green compact (step (C1)) and the case where densification is performed without infiltration after sintering the green compact (step (C1)). In the latter case, the amount of Cu powder appropriate to the Cu content in the Cu—Mo composite material (a) is contained.

The purity and the particle size of each of the Mo powder and the Cu powder used are not limited. Typically, the Mo powder has a purity of 99.95 mass % or more and a FSSS average particle size of about 1 μm to 8 μm, and the Cu powder is pure Cu, such as an electrolytic copper powder or an atomized copper powder, with an average particle size D50 of about 5 μm to 50 μm.

In step (A), a Mo powder or a mixed powder of a Mo powder and a Cu powder is charged into a mold, and pressed while adjusting pressure according to the filling ability of the mixed powder used and the target forming density of the green compact, to obtain a green compact.

In step (B), the green compact obtained in step (A) is sintered in a reducing atmosphere (e.g. hydrogen atmosphere) or in a vacuum, to obtain a sintered body. The sintering may be performed under typical conditions. In the case where the green compact is made of a mixed powder of a Mo powder and a Cu powder, the sintering is preferably performed under conditions of holding at a temperature of about 900° C. to 1050° C. (preferably 950° C. to 1000° C.) for about 30 min to 1000 min. In the case where the green compact is made of a Mo powder, the sintering is preferably performed under conditions of holding at a temperature of about 1100° C. to 1400° C. (preferably 1200° C. to 1300° C.) for about 30 min to 1000 min.

In step (C1), the sintered body (porous body) obtained in step (B) is impregnated with Cu molten in a non-oxidizing atmosphere or in a vacuum (Cu infiltration), to obtain a Cu—Mo composite material (a). In the case of performing step (C1), desired Cu content is ensured by Cu infiltration.

The Cu infiltration may be performed under typical conditions. For example, a Cu sheet or a Cu powder is placed on the upper surface and/or the lower surface of the sintered body, and held at a temperature of about 1083° C. to 1300° C. (preferably 1150° C. to 1250° C.) for 20 min to 600 min. The non-oxidizing atmosphere is not limited, but is prefer-ably a hydrogen atmosphere. In terms of improving workability after infiltration, infiltration in a vacuum is preferable.

In the case of performing step (B) and step (C1) in sequence, in a state in which a Cu sheet or a Cu powder for Cu infiltration is placed on the green compact obtained in step (A), the green compact may be first heated to the sintering temperature to perform step (B) and then heated to the Cu infiltration temperature to perform step (C1).

The Cu—Mo composite material (infiltrated body) obtained in step (C1) is preferably subjected to surface grinding (e.g. surface grinding using a milling machine or a whetstone) to remove excess pure Cu remaining on the surface, prior to the cold rolling in the next step.

In step (C2) as an alternative to step (C1), the sintered body obtained in step (B) is densified to obtain a Cu—Mo composite material (a). In this case, after the sintering in step (B), the temperature may be further increased to melt Cu (a process of holding at about 1200° C. to 1300° C. for about 20 min to 120 min), before the densification in step (C2).

The densification requires high temperature and pressure, and may be performed by a method such as hot pressing, spark plasma sintering (SPS), or heat rolling. Through the densification process, the sintered body is densified by reducing voids in the sintered body, thus increasing the relative density.

In step (D), the Cu—Mo composite material obtained in step (C1) or (C2) is subjected to rolling (y) at a predetermined rolling reduction, in order to decrease the coefficient of thermal expansion of the Cu—Mo composite material (a).

Before rolling the Cu—Mo composite material obtained in step (C1) or (C2), the Cu—Mo composite material may be optionally subjected to homogenization aging heat treatment at a temperature of about 800° C. to 1000° C.

The heat sink according to the present disclosure as cold rolled or warm rolled or after softening aging heat treatment can be used as a product. A coating or plating such as a Ni coating or plating may be optionally formed on the surface of the heat sink, in order to improve performance such as corrosion resistance and electrolytic corrosion resistance for use as a base of a semiconductor. This coating or plating is formed with such a thickness that does not significantly affect the thermal properties of the heat sink. The type of the coating or plating is not limited. Examples include a Ni coating or plating, a Cu coating or plating, a Au coating or plating, and a Ag coating or plating. These coatings or platings may be used singly or in combination of two or more layers. The coating or plating may be formed on only one side of the heat sink (i.e. on the surface of one of the two Cu—Mo composite layers which are the outermost layers), or on both sides of the heat sink. To improve coatability or platability when forming the coating or plating such as a Ni coating or plating on the heat sink surface, a Cu coating or plating as a base film may be formed on the heat sink surface (the surfaces of the Cu—Mo composite layers which are the outermost layers). The preferable thickness of the coating or plating formed is as described above.

The heat sink according to the present disclosure is suitable for use in semiconductor packages such as ceramic packages or metal packages included in various semiconductor modules, and exhibits high heat-sink property and tolerance. In particular, the heat sink according to the present disclosure can, while having high thermal conductivity, maintain a low coefficient of thermal expansion even after exposed to high temperature of more than 800° C., and therefore can be appropriately used in applications involving brazing bonding that requires a high bonding temperature of 750° C. or more.

EXAMPLES

First Example (1) Manufacturing Conditions of Cu—Mo Composite Material

A mixed powder produced by mixing a Mo powder (FSSS average particle size: 6 μm) and a pure Cu powder (average particle size D50: 5 μm) in a predetermined proportion was put in a mold (50 mm×50 mm) and pressed, to obtain a green compact with a thickness corresponding to the rolling reduction in cold rolling in a subsequent step. The green compact was sintered (1000° C., 600 min) in a hydrogen atmosphere, to obtain a sintered body. A pure Cu sheet was placed on the upper surface of the sintered body, and heated to 1200° C. in a hydrogen atmosphere (holding time: 180 min) to melt the pure Cu sheet and cause the sintered body to be impregnated with the molten Cu, thus obtaining a Cu—Mo composite material having a predetermined Cu content. After removing Cu remaining on the surface of the Cu—Mo composite material using a milling machine, the Cu—Mo composite material was subjected to unidirectional rolling (y) (cold rolling) at a predetermined rolling reduction, to produce a Cu—Mo composite material.

(2) Manufacturing Conditions of each Test Piece (2.1) Example

The Cu—Mo composite material with the predetermined thickness obtained as described above and a pure Cu sheet were stacked to form a three-layer structure of (Cu—Mo)/Cu/(Cu—Mo) or a five-layer structure of (Cu—Mo)/Cu/(Cu—Mo)/Cu/(Cu—Mo). The stacked Cu—Mo composite material and Cu material were diffusion bonded using a spark plasma sintering (SPS) device (DR. SINTER SPS-1050 produced by Sumitomo Coal Mining Co., Ltd.), under conditions of 950° C., a holding time of 18 min, and a pressing force of 20 MPa, to obtain a laminate. The laminate was then subjected to rolling (cold rolling) in a direction orthogonal to the rolling direction of the rolling (y) (cold rolling) of the Cu—Mo composite material at the same rolling reduction as the rolling (y), to manufacture a heat sink (thickness: 1 mm) of Example.

(2.2) Comparative Example

A heat sink (thickness: 1 mm) of Comparative Example was manufactured under the same conditions as Example except that the Cu—Mo composite material and the pure Cu sheet formed a three-layer structure of Cu/(Cu—Mo)/Cu (Comparative Examples 3, 5, 7, 9, and 11).

The Cu—Mo composite material alone was also used as a heat sink (thickness: 1 mm) of Comparative Example (Comparative Examples 1, 2, 4, 6, 8, and 10).

(3) Measurement of Thermal Properties

For each test piece, the in-plane coefficient of thermal expansion was measured by a pushrod-type displacement detection method. The difference in elongation between 50° C. and 400° C. and the difference in elongation between 50° C. and 800° C. were each divided by the temperature difference, to calculate the average in-plane coefficient of thermal expansion from 50° C. to 400° C. and the average in-plane coefficient of thermal expansion from 50° C. to 800° C. In addition, the thermal conductivity in the thickness direction (thermal conductivity at room temperature) was measured by a flash method.

(4) Evaluation of Thermal Properties

The thermal properties of each test piece are shown in Tables 1 and 2 together with the manufacturing conditions. As shown in the tables, Examples had considerably higher thermal conductivity in the thickness direction than Comparative Examples.

TABLE 1

| No. | Type | Clad structure *2 | Clad conditions *1 Cu content of Cu—Mo (mass %) | Total cold rolling reduction (%) *3 |
|---|---|---|---|---|
| Example 1 | Three-layer clad material | Cu—Mo/Cu/Cu—Mo (1.4)(1.4)(1.4) | 40 | 93.5 |
| Comparative Example 1 | Cu—Mo composite material alone | — | 45 | 80 |
| Comparative Example 2 | Cu—Mo composite material alone | — | 51 | 93 |
| Comparative Example 3 | Three-layer clad material | Cu/Cu—Mo/Cu (0.7)(2.8)(0.7) | 40 | 93.5 |
| Example 2 | Three-layer clad material | Cu—Mo/Cu/Cu—Mo (5) (3) (5) | 45 | 92 |
| Comparative Example 4 | Cu—Mo composite material alone | — | 51 | 90 |
| Comparative Example 5 | Three-layer clad material | Cu/Cu—Mo/Cu (1.5)(10)(1.5) | 45 | 92 |
| Example 3 | Five-layer clad material | Cu—Mo/Cu/Cu—Mo/Cu/Cu—Mo (1.1)(0.9)(1.1)(0.9) (1.1) | 40 | 95.5 |
| Comparative Example 6 | Cu—Mo composite material alone | — | 40 | 80 |

| No. | Thickness (mm) | Mo phase aspect ratio (—) | Density (g/m³) | Thermal conductivity in thickness direction (W/m · K) | In-plane coefficient of thermal expansion (×10⁻⁶/K) 400° C. *4 | In-plane coefficient of thermal expansion (×10⁻⁶/K) 800° C. *5 |
|---|---|---|---|---|---|---|
| Example 1 | 1 | 4 | 9.42 | 266 | 9.4 | 9.1 |
| Comparative Example 1 | 1 | 2.1 | 9.59 | 225 | 9.4 | 9.3 |
| Comparative Example 2 | 1 | 3.5 | 9.55 | 224 | 9.5 | 9.1 |
| Comparative Example 3 | 1 | 4 | 9.42 | 240 | 9.5 | 9.2 |

TABLE 1-continued

| | | | | | | |
|---|---|---|---|---|---|---|
| Example 2 | 1 | 3.2 | 9.44 | 258 | 9.6 | 9.2 |
| Comparative Example 4 | 1 | 2.9 | 9.55 | 228 | 9.7 | 9.4 |
| Comparative Example 5 | 1 | 3.2 | 9.44 | 234 | 9.6 | 9.2 |
| Example 3 | 1 | 4.3 | 9.40 | 268 | 9.2 | 8.6 |
| Comparative Example 6 | 1 | 2.1 | 9.65 | 211 | 9.1 | 8.8 |

*1 Cu: Cu material, Cu—Mo: Cu—Mo composite material
*2 The numbers in brackets are thicknesses of respective materials before cladding (mm)
*3 Total rolling reduction combining rolling reduction of Cu—Mo composite material alone and rolling reduction of Cu—Mo composite material in clad material rolling
*4 Average coefficient of thermal expansion from 50° C. to 400° C.
*5 Average coefficient of thermal expansion from 50° C. to 800° C.

TABLE 2

| | | | Clad conditions *1 | | Total cold |
|---|---|---|---|---|---|
| No. | Type | Clad structure *2 | | Cu content of Cu—Mo (mass %) | rolling reduction (%) *3 |
| Comparative Example 7 | Three-layer clad material | Cu/Cu—Mo/Cu (0.8) (3) (0.8) | | 40 | 93.5 |
| Example 4 | Five-layer clad material | Cu—Mo/Cu/Cu—Mo/Cu/Cu—Mo (1.2) (0.5) (1.2) (0.5) (1.2) | | 40 | 95 |
| Comparative Example 8 | Cu—Mo composite material alone | — | | 40 | 90 |
| Comparative Example 9 | Three-layer clad material | Cu/Cu—Mo/Cu (0.5) (3.6) (0.5) | | 40 | 95 |
| Example 5 | Three-layer clad material | Cu—Mo/Cu/Cu—Mo (1.5) (0.8) (1.5) | | 40 | 92 |
| Comparative Example 10 | Cu—Mo composite material alone | — | | 55 | 99.6 |
| Comparative Example 11 | Three-layer clad material | Cu/Cu—Mo/Cu (0.4) (3) (0.4) | | 40 | 92 |
| Example 6 | Three-layer clad material | Cu—Mo/Cu/Cu—Mo (5) (3) (5) | | 44 | 92 |

| | | | | | Thermal properties | |
|---|---|---|---|---|---|---|
| | | Mo phase aspect ratio | Density | Thermal conductivity in thickness direction | In-plane coefficient of thermal expansion ($\times 10^{-6}$/K) | |
| No. | Thickness (mm) | (—) | (g/m$^3$) | (W/m · K) | 400° C. *4 | 800° C. *5 |
| Comparative Example 7 | 1 | 3.9 | 9.41 | 220 | 9.2 | 8.7 |
| Example 4 | 1 | 4.1 | 9.50 | 240 | 9.0 | 8.4 |
| Comparative Example 8 | 1 | 2.9 | 9.65 | 208 | 8.8 | 8.3 |
| Comparative Example 9 | 1 | 4.1 | 9.50 | 220 | 9.0 | 8.4 |
| Example 5 | 1 | 3.3 | 9.50 | 244 | 9.1 | 8.6 |
| Comparative Example 10 | 1 | 15.3 | 9.50 | 203 | 10.0 | 8.6 |
| Comparative Example 11 | 1 | 3.3 | 9.50 | 220 | 9.1 | 8.6 |
| Example 6 | 1 | 3.7 | 9.44 | 249 | 9.6 | 9.2 |

*1 Cu: Cu material, Cu—Mo: Cu—Mo composite material
*2 The numbers in brackets are thicknesses of respective materials before cladding (mm)
*3 Total rolling reduction combining rolling reduction of Cu—Mo composite material alone and rolling reduction of Cu—Mo composite material in clad material rolling
*4 Average coefficient of thermal expansion from 50° C. to 400° C.
*5 Average coefficient of thermal expansion from 50° C. to 800° C.

Second Example (1) Manufacturing Conditions of Cu—Mo Composite Material

A Cu—Mo composite material with a Cu content of 30 mass % or more was produced by the same method and conditions as in the first example. A Cu—Mo composite material with a Cu content of less than 30 mass % was produced as follows. A Mo powder (FSSS average particle size: 6 μm) was put in a mold (50 mm×50 mm) and pressed, to obtain a green compact with a thickness corresponding to the rolling reduction in cold rolling in a subsequent step. The green compact was sintered (1300° C., 600 min) in a hydrogen atmosphere, to obtain a sintered body. A pure Cu sheet was placed on the upper surface of the sintered body, and heated to 1200° C. in a hydrogen atmosphere (holding time: 180 min) to melt the pure Cu sheet and cause the sintered body to be impregnated with the molten Cu, thus obtaining a Cu—Mo composite material having a predetermined Cu content. After removing Cu remaining on the surface of the Cu—Mo composite material using a milling machine, the Cu—Mo composite material was subjected to unidirectional rolling (y) (cold rolling) at a predetermined rolling reduction, to produce a Cu—Mo composite material.

(2) Manufacturing Conditions of each Test Piece (2.1) Example

The Cu—Mo composite material with the predetermined thickness obtained as described above and a pure Cu sheet were stacked to form a three-layer structure of (Cu—Mo)/Cu/(Cu—Mo), a five-layer structure of (Cu—Mo)/Cu/(Cu—

Mo)/Cu/(Cu—Mo), or a seven-layer structure of (Cu—Mo)/Cu/(Cu—Mo)/Cu/(Cu—Mo)/Cu/(Cu—Mo). The stacked Cu—Mo composite material (a) and Cu material (b) were diffusion bonded and rolled (cold rolled) by the same methods and conditions as in the first example, to manufacture a heat sink (thickness: 1 mm) of Example.

(2.2) Comparative Example

A heat sink (thickness: 1 mm) of Comparative Example was manufactured under the same conditions as Examples except that the Cu—Mo composite material and the pure Cu sheet formed a three-layer structure of Cu/(Cu—Mo)/Cu (Comparative Examples 12 and 13).

The Cu—Mo composite material alone was also used as a heat sink (thickness: 1 mm) of Comparative Example (Comparative Examples 14 to 30).

(3) Measurement of Thermal Properties

For each test piece, the average in-plane coefficient of thermal expansion and the thermal conductivity in the thickness direction (thermal conductivity at room temperature) were measured and calculated by the same methods as in the first example.

(4) Evaluation of Thermal Properties

The thermal properties of each test piece are shown in Tables 3 and 4 together with the manufacturing conditions. As shown in the tables, Examples had considerably higher thermal conductivity than Comparative Examples. In particular, Examples achieved excellent thermal properties with highly satisfactory high thermal conductivity and low coefficient of thermal expansion, because the Cu content in the Cu—Mo composite layer was 20 mass % to 30 mass %.

TABLE 3

| No. | Type | Clad structure *2 | Cu content of Cu—Mo (mass %) | Outermost layer thickness/ thickness (—) | Total cold rolling reduction (%) *3 |
|---|---|---|---|---|---|
| Example 7 | Three-layer clad material | Cu—Mo/Cu/Cu—Mo (1.0) (3.0) (1.0) | 25 | 0.20 | 95 |
| Example 8 | Three-layer clad material | Cu—Mo/Cu/Cu—Mo (1.2) (2.4) (1.2) | 25 | 0.25 | 95 |
| Example 9 | Five-layer clad material | Cu—Mo/Cu/Cu—Mo/Cu/Cu—Mo (0.67) (1.5)(0.67)(1.5) (0.67) | 25 | 0.134 | 95 |
| Example 10 | Five-layer clad material | Cu—Mo/Cu/Cu—Mo/Cu/Cu—Mo (0.8) (1.2) (0.8) (1.2) (0.8) | 25 | 0.167 | 95 |
| Example 11 | Seven-layer clad material | Cu—Mo/Cu/. . ./Cu/Cu—Mo (0.5) (1.0) (1.0) (0.5) | 25 | 0.125 | 95 |
| Example 12 | Seven-layer clad material | Cu—Mo/Cu/. . ./Cu/Cu—Mo (0.6) (0.8) (0.8) (0.6) | 25 | 0.125 | 95 |
| Comparative Example 12 | Three-layer clad material | Cu/Cu—Mo/Cu (1.5)(2.0)(1.5) | 25 | 0.30 | 95 |
| Comparative Example 13 | Three-layer clad material | Cu/Cu—Mo/Cu (1.2)(2.4)(1.2) | 25 | 0.25 | 95 |
| Example 13 | Three-layer clad material | Cu—Mo/Cu/Cu—Mo (1.0) (3.0) (1.0) | 25 | 0.20 | 70 |
| Example 14 | Three-layer clad material | Cu—Mo/Cu/Cu—Mo (1.3) (2.5) (1.3) | 25 | 0.25 | 70 |

| | | | | Thermal properties | | |
|---|---|---|---|---|---|---|
| | | Cu content of whole heat sink | Density | Thermal conductivity in thickness direction | In-plane coefficient of thermal expansion ($\times 10^{-6}$/K) | |
| No. | Thickness (mm) | (mass %) | (g/m$^3$) | (W/m · K) | 400° C. *4 | 800° C. *5 |
| Example 7 | 1 | 66 | 9.33 | 310 | 8.6 | 7.9 |
| Example 8 | 1 | 58 | 9.42 | 275 | 8.0 | 7.5 |
| Example 9 | 1 | 67 | 9.31 | 295 | 8.4 | 7.5 |
| Example 10 | 1 | 61 | 9.39 | 271 | 8.1 | 7.3 |
| Example 11 | 1 | 68 | 9.30 | 287 | 8.4 | 7.4 |
| Example 12 | 1 | 61 | 9.38 | 265 | 7.9 | 7.1 |
| Comparative Example 12 | 1 | 68 | 9.30 | 236 | 8.3 | 8.0 |
| Comparative Example 13 | 1 | 62 | 9.37 | 216 | 8.0 | 7.6 |
| Example 13 | 1 | 69 | 9.29 | 331 | 10.0 | 9.3 |
| Example 14 | 1 | 69 | 9.38 | 298 | 9.1 | 8.4 |

*1 Cu: Cu material, Cu—Mo: Cu—Mo composite material
*2 The numbers in brackets are thicknesses of respective materials before cladding (mm)
*3 Total rolling reduction combining rolling reduction of Cu—Mo composite material alone and rolling reduction of Cu—Mo composite material in clad material rolling
*4 Average coefficient of thermal expansion from 50° C. to 400° C.
*5 Average coefficient of thermal expansion from 50° C. to 800° C.

TABLE 4

| | Type | Clad structure *2 | Clad conditions *1 | | |
|---|---|---|---|---|---|
| | | | Cu content of Cu—Mo (mass %) | Outermost layer thickness/ thickness (—) | Total cold rolling reduction (%) *3 |
| Comparative Example 14 | Cu—Mo composite material alone | — | 66 | — | 93.5 |
| Comparative Example 15 | Cu—Mo composite material alone | — | 59 | — | 93.5 |
| Comparative Example 16 | Cu—Mo composite material alone | — | 61 | — | 93.5 |
| Comparative Example 17 | Cu—Mo composite material alone | — | 60 | — | 93.5 |
| Comparative Example 18 | Cu—Mo composite material alone | — | 61 | — | 93.5 |
| Comparative Example 19 | Cu—Mo composite material alone | — | 27 | — | 20 |
| Comparative Example 20 | Cu—Mo composite material alone | — | 26 | — | 30 |
| Comparative Example 21 | Cu—Mo composite material alone | — | 27 | — | 40 |
| Comparative Example 22 | Cu—Mo composite material alone | — | 29 | — | 50 |
| Comparative Example 23 | Cu—Mo composite material alone | — | 27 | — | 70 |
| Comparative Example 24 | Cu—Mo composite material alone | — | 27 | — | 80 |
| Comparative Example 25 | Cu—Mo composite material alone | — | 27 | — | 90 |
| Comparative Example 26 | Cu—Mo composite material alone | — | 26 | — | 95 |
| Comparative Example 27 | Cu—Mo composite material alone | — | 26 | — | 98 |
| Comparative Example 28 | Cu—Mo composite material alone | — | 44 | — | 90 |
| Comparative Example 29 | Cu—Mo composite material alone | — | 44 | — | 93.5 |
| Comparative Example 30 | Cu—Mo composite material alone | — | 40 | — | 93.5 |

| | Thickness (mm) | Cu content of whole heat sink (mass %) | Density (g/m$^3$) | Thermal properties | | |
|---|---|---|---|---|---|---|
| | | | | Thermal conductivity in thickness direction (W/m·K) | In-plane coefficient of thermal expansion (×10$^{-6}$/K) | |
| | | | | | 400° C. *4 | 800° C. *5 |
| Comparative Example 14 | 1 | 66 | 9.32 | 277 | 11.7 | 11.3 |
| Comparative Example 15 | 1 | 59 | 9.41 | 249 | 10.5 | 9.4 |
| Comparative Example 16 | 1 | 61 | 9.39 | 251 | 10.3 | 9.2 |
| Comparative Example 17 | 1 | 60 | 9.40 | 251 | 10.5 | 9.3 |
| Comparative Example 18 | 1 | 61 | 9.39 | 260 | 11.2 | 10.7 |
| Comparative Example 19 | 1 | 27 | 9.82 | 202 | 8.6 | 8.8 |
| Comparative Example 20 | 1 | 26 | 9.83 | 196 | 8.4 | 8.2 |
| Comparative Example 21 | 1 | 27 | 9.82 | 194 | 8.2 | 7.7 |
| Comparative Example 22 | 1 | 29 | 9.80 | 197 | 8.0 | 7.3 |
| Comparative Example 23 | 1 | 27 | 9.82 | 189 | 7.6 | 6.9 |
| Comparative Example 24 | 1 | 27 | 9.82 | 184 | 7.4 | 6.8 |
| Comparative Example 25 | 1 | 27 | 9.82 | 177 | 7.2 | 6.7 |
| Comparative Example 26 | 1 | 26 | 9.83 | 175 | 7.2 | 6.8 |
| Comparative Example 27 | 1 | 26 | 9.83 | 168 | 7.4 | 6.9 |
| Comparative Example 28 | 1 | 44 | 9.60 | 221 | 9.3 | 8.7 |
| Comparative Example 29 | 1 | 44 | 9.60 | 214 | 9.1 | 8.4 |
| Comparative Example 30 | 1 | 40 | 9.65 | 206 | 8.8 | 8.1 |

*1 Cu: Cu material, Cu—Mo: Cu—Mo composite material
*2 The numbers in brackets are thicknesses of respective materials before cladding (mm)
*3 Total rolling reduction combining rolling reduction of Cu—Mo composite material alone and rolling reduction of Cu—Mo composite material in clad material rolling
*4 Average coefficient of thermal expansion from 50° C. to 400° C.
*5 Average coefficient of thermal expansion from 50° C. to 800° C.

Third Example (1) Manufacturing Conditions of Cu—Mo Composite Material

A Cu—Mo composite material was produced by the same method and conditions as in the second example (in the case of a Cu—Mo composite material having a Cu content of less than 30 mass %), except that the rolling was warm rolling at 250° C.

(2) Manufacturing Conditions of Test Piece of Example

A heat sink (thickness: 1 mm) of Example was manufactured by performing diffusion bonding and rolling by the same methods and conditions as in the first example, except that the Cu—Mo composite material with the predetermined thickness obtained as described above and a pure Cu sheet were stacked to form a three-layer structure of (Cu—Mo)/Cu/(Cu—Mo) and the rolling was performed by warm rolling at 250° C.

(3) Measurement of Thermal Properties

For each test piece, the average in-plane coefficient of thermal expansion and the thermal conductivity in the thickness direction (thermal conductivity at room temperature) were measured and calculated by the same methods as in the first example.

(4) Evaluation of Thermal Properties

The thermal properties of each test piece are shown in Table 5 together with the manufacturing conditions. As shown in the table, with warm rolling, rolling at a total rolling reduction of 98% was possible in the case where the Cu content in the Cu—Mo composite material was 25 mass %, and rolling at a total rolling reduction of 96% was possible in the case where the Cu content in the Cu—Mo composite material was 15 mass %. Each Example achieved excellent thermal properties with highly satisfactory high thermal conductivity and low coefficient of thermal expansion.

TABLE 5

| No. | Type | Clad structure *2 | Clad conditions *1 | | | |
|---|---|---|---|---|---|---|
| | | | Cu content of Cu—Mo (mass %) | Outermost layer thickness/ thickness (—) | Total warm rolling reduction (%) *3 | Thickness (mm) |
| Example 15 | Three-layer clad material | Cu—Mo/Cu/Cu—Mo (2.0) (4.4) (2.0) | 25 | 0.24 | 97.5 | 1 |
| Example 16 | Three-layer clad material | Cu—Mo/Cu/Cu—Mo (1.8) (5.6) (1.8) | 25 | 0.20 | 98 | 1 |
| Example 17 | Three-layer clad material | Cu—Mo/Cu/Cu—Mo (1.15)(3) (1.15) | 15 | 0.22 | 95 | 1 |
| Example 18 | Three-layer clad material | Cu—Mo/Cu/Cu—Mo (0.9) (3.4) (0.9) | 15 | 0.17 | 96 | 1 |

| No. | Cu content of whole heat sink (mass %) | Density (g/m$^3$) | Thermal properties | | |
|---|---|---|---|---|---|
| | | | Thermal conductivity in thickness direction (W/m · K) | In-plane coefficient of thermal expansion (×10$^{-6}$/K) | |
| | | | | 400° C. *4 | 800° C. *5 |
| Example 15 | 62 | 9.37 | 289 | 8.4 | 7.8 |
| Example 16 | 68 | 9.30 | 315 | 9.0 | 8.3 |
| Example 17 | 57 | 9.44 | 280 | 7.6 | 7.4 |
| Example 18 | 67 | 9.31 | 320 | 8.1 | 7.7 |

*1 Cu: Cu material, Cu—Mo: Cu—Mo composite material
*2 The numbers in brackets are thicknesses of respective materials before cladding (mm)
*3 Total rolling reduction combining rolling reduction of Cu—Mo composite material alone and rolling reduction of Cu—Mo composite material in clad material rolling
*4 Average coefficient of thermal expansion from 50° C. to 400° C.
*5 Average coefficient of thermal expansion from 50° C. to 800° C.

Fourth Example (1) Manufacturing Conditions of Cu—Mo Composite Material

A Cu—Mo composite material was produced by the same method and conditions as in the second example (in the case of a Cu—Mo composite material having a Cu content of less than 30 mass %).

(2) Manufacturing Conditions of Test Piece of Example

The Cu—Mo composite material with the predetermined thickness obtained as described above and a pure Cu sheet were stacked to form a three-layer structure of (Cu—Mo)/Cu/(Cu—Mo), and diffusion bonded and rolled (cold rolled) by the same methods and conditions as in the first example, to produce a heat sink body (thickness: 1 mm). A Cu coating or plating of 10 or 20 µm in thickness was formed on both sides of the heat sink body by electroplating, to manufacture a heat sink of Example.

(3) Measurement of Thermal Properties

For each test piece, the average in-plane coefficient of thermal expansion and the thermal conductivity in the thickness direction (thermal conductivity at room temperature) were measured and calculated by the same methods as in the first example.

(4) Evaluation of Thermal Properties

The thermal properties of each test piece are shown in Table 6 together with the manufacturing conditions. Of these test pieces, the structure of the heat sink body of each of Examples 19 and 21 is approximately the same as the structure of the heat sink of Example 7, and accordingly their thermal properties can be compared with each other. Moreover, the structure of the heat sink body of each of Examples 20 and 22 is approximately the same as the structure of the heat sink of Example 8, and accordingly their thermal properties can be compared with each other.

The thermal properties of the heat sinks of Examples 19 and 20 having a Cu coating or plating with a thickness of 10 µm were approximately the same as the thermal properties of the heat sinks of Examples 7 and 8, respectively. The heat sinks of Examples 21 and 22 having a Cu coating or plating with a thickness of 20 µm were somewhat lower in the thermal conductivity in the thickness direction than the heat sinks of Examples 7 and 8 respectively, but the decrease amounts were less than 10 W/m·K.

TABLE 6

| No. | Type | Clad structure *2 | Clad conditions *1 | | |
|---|---|---|---|---|---|
| | | | Cu content of Cu—Mo (mass %) | Outermost layer thickness/ thickness (—) | Total cold rolling reduction (%) *3 |
| Example 19 | Three-layer clad material + Cu coating or plating (10 µm) | Cu—Mo/Cu/Cu—Mo (1.0) (2.9) (1.0) | 25 | 0.20 | 95 |
| Example 20 | Three-layer clad material + Cu coating or plating (10 µm) | Cu—Mo/Cu/Cu—Mo (1.2) (2.3) (1.2) | 25 | 0.26 | 95 |

TABLE 6-continued

| | | | | | |
|---|---|---|---|---|---|
| Example 21 | Three-layer clad material + Cu coating or plating (20 μm) | Cu—Mo/Cu/Cu—Mo (1.0) (2.8) (1.0) | 25 | 0.21 | 95 |
| Example 22 | Three-layer clad material + Cu coating or plating (20 μm) | Cu—Mo/Cu/Cu—Mo (1.2) (2.2) (1.2) | 25 | 0.26 | 95 |

| | | | | Thermal properties | |
|---|---|---|---|---|---|
| | | | Thermal conductivity in thickness direction | In-plane coefficient of thermal expansion (×10⁻⁶/K) | |
| | | Cu content of whole heat sink | Density | | |
| No. | Thickness (mm) | (mass %) | (g/m³) | (W/m · K) | 400° C. *4 | 800° C. *5 |
| Example 19 | 1 | 69 | 9.29 | 311 | 8.7 | 8.0 |
| Example 20 | 1 | 60 | 9.40 | 281 | 8.2 | 7.6 |
| Example 21 | 1 | 68 | 9.30 | 306 | 8.7 | 8.0 |
| Example 22 | 1 | 60 | 9.40 | 272 | 8.4 | 7.8 |

*1 Cu: Cu material, Cu—Mo: Cu—Mo composite material
*2 The numbers in brackets are thicknesses of respective materials before cladding (mm)
*3 Total rolling reduction combining rolling reduction of Cu—Mo composite material alone and rolling reduction of Cu—Mo composite material in clad material rolling
*4 Average coefficient of thermal expansion from 50° C. to 400° C.
*5 Average coefficient of thermal expansion from 50° C. to 800° C.

The invention claimed is:

1. A heat sink comprising a pair of Cu—Mo composite layers and a Cu layer stacked in a thickness direction so that the Cu layer is interposed between the Cu—Mo composite layers,
    wherein each of the Cu—Mo composite layers has a thickness section microstructure in which flat Mo phase is dispersed in a Cu matrix, and
    wherein each of the Cu—Mo composite layers is an outermost layer.

2. The heat sink according to claim 1, wherein each of the Cu—Mo composite layers has a Cu content of 10 mass % to 50 mass %.

3. A semiconductor package comprising the heat sink according to claim 2.

4. A semiconductor module comprising the semiconductor package according to claim 3.

5. The heat sink according to claim 2, wherein a coating or plating is formed on one side or both sides of a heat sink body composed of the stacked Cu-Mo composite layers and one or more Cu layers, the coating or plating having a thickness with which thermal conductivity in the thickness direction is not lower than thermal conductivity in the thickness direction of the heat sink body by 10 W/m·K or more.

6. A semiconductor package comprising the heat sink according to claim 5.

7. A semiconductor module comprising the semiconductor package according to claim 6.

8. The heat sink according to claim 1, wherein a coating or plating is formed on one side or both sides of a heat sink body composed of the stacked Cu—Mo composite layers and one or more Cu layers, the coating or plating having a thickness with which thermal conductivity in the thickness direction is not lower than thermal conductivity in the thickness direction of the heat sink body by 10 W/m·K or more.

9. A semiconductor package comprising the heat sink according to claim 8.

10. A semiconductor module comprising the semiconductor package according to claim 9.

11. A semiconductor package comprising the heat sink according to claim 1.

12. A semiconductor module comprising the semiconductor package according to claim 11.

13. A heat sink comprising three or more Cu—Mo composite layers and two or more Cu layers alternately stacked in a thickness direction so that two of the Cu—Mo composite layers are outermost layers on both sides,
    wherein each of the Cu—Mo composite layers has a thickness section microstructure in which flat Mo phase is dispersed in a Cu matrix.

14. The heat sink according to claim 13, wherein each of the Cu—Mo composite layers has a Cu content of 10 mass % to 50 mass %.

15. A semiconductor package comprising the heat sink according to claim 14.

16. A semiconductor module comprising the semiconductor package according to claim 15.

17. The heat sink according to claim 14, wherein a coating or plating is formed on one side or both sides of a heat sink body composed of the stacked Cu—Mo composite layers and one or more Cu layers, the coating or plating having a thickness with which thermal conductivity in the thickness direction is not lower than thermal conductivity in the thickness direction of the heat sink body by 10 W/m·K or more.

18. A semiconductor package comprising the heat sink according to claim 17.

19. A semiconductor module comprising the semiconductor package according to claim 18.

20. The heat sink according to claim 13, wherein a coating or plating is formed on one side or both sides of a heat sink body composed of the stacked Cu—Mo composite layers and one or more Cu layers, the coating or plating having a thickness with which thermal conductivity in the thickness direction is not lower than thermal conductivity in the thickness direction of the heat sink body by 10 W/m·K or more.

21. A semiconductor package comprising the heat sink according to claim 20.

22. A semiconductor module comprising the semiconductor package according to claim 21.

23. A semiconductor package comprising the heat sink according to claim 13.

24. A semiconductor module comprising the semiconductor package according to claim 23.

* * * * *